US012516443B2

(12) United States Patent
Miyase

(10) Patent No.: US 12,516,443 B2
(45) Date of Patent: Jan. 6, 2026

(54) SILICON CARBIDE EPITAXIAL SUBSTRATE

(71) Applicant: SUMITOMO ELECTRIC INDUSTRIES, LTD., Osaka (JP)

(72) Inventor: Takaya Miyase, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 381 days.

(21) Appl. No.: 18/273,774

(22) PCT Filed: Jan. 28, 2022

(86) PCT No.: PCT/JP2022/003330
§ 371 (c)(1),
(2) Date: Jul. 23, 2023

(87) PCT Pub. No.: WO2022/172787
PCT Pub. Date: Aug. 18, 2022

(65) Prior Publication Data

US 2024/0301585 A1 Sep. 12, 2024

(30) Foreign Application Priority Data

Feb. 15, 2021 (JP) ................................ 2021-021700

(51) Int. Cl.
*C30B 29/36* (2006.01)
*C30B 25/20* (2006.01)
*C30B 23/00* (2006.01)
*C30B 25/18* (2006.01)

(52) U.S. Cl.
CPC .............. *C30B 25/20* (2013.01); *C30B 29/36* (2013.01); *C30B 23/00* (2013.01); *C30B 25/186* (2013.01)

(58) Field of Classification Search
CPC ....... C30B 25/20; C30B 25/186; C30B 29/36; C30B 23/00
See application file for complete search history.

(56) References Cited

U.S. PATENT DOCUMENTS

2024/0304676 A1* 9/2024 Miyase .............. H10D 62/8325
2024/0363696 A1* 10/2024 Nishihara ............. H10D 62/57

FOREIGN PATENT DOCUMENTS

CN 111051581 A * 4/2020 ............. C30B 25/20
JP 2-267196 A 10/1990
JP 2-267197 A 10/1990
(Continued)

*Primary Examiner* — Robert M Kunemund
(74) *Attorney, Agent, or Firm* — Renner, Otto, Boisselle & Sklar, LLP

(57) ABSTRACT

The first area density is 0.03/cm$^2$ or more, and a value obtained by dividing the second area density by a sum of the first area density and the second area density is 10% or less. As viewed in a direction perpendicular to the main surface, the first recess extends in a straight line along a direction inclined with respect to each of the first direction and a second direction perpendicular to the first direction, and a first-direction-side end portion of the first recess is contiguous to a 4H polytype region, and as viewed in the direction perpendicular to the main surface, the second recess extends in a straight line along a direction inclined with respect to each of the first direction and the second direction, and a first-direction-side end portion of the second recess is contiguous to a 3C polytype region.

6 Claims, 20 Drawing Sheets

(56) References Cited

FOREIGN PATENT DOCUMENTS

| | | | | |
|---|---|---|---|---|
| JP | 2015-2207 | A | 1/2015 | |
| WO | 2015/170500 | A1 | 11/2015 | |
| WO | 2016/067918 | A1 | 5/2016 | |
| WO | WO-2017064913 | A1 * | 4/2017 | ....... H01L 21/30604 |

* cited by examiner

SILICON CARBIDE EPITAXIAL SUBSTRATE

TECHNICAL FIELD

The present disclosure relates to a silicon carbide epitaxial substrate. This application claims priority based on Japanese Patent Application No. 2021-021700 filed on Feb. 15, 2021, and the entire contents of the Japanese patent application are incorporated herein by reference.

BACKGROUND ART

WO 2015/170500 (PTL 1) describes a silicon carbide epitaxial wafer including a silicon carbide substrate, a defect reduction layer and a drift layer. In the silicon carbide epitaxial wafer, the number of carrot defects generated from a portion other than the vicinity of the interface between the defect reduction layer and the silicon carbide substrate is 4.5 times to 7.5 times the number of carrot defects generated from the vicinity of the interface between the defect reduction layer and the silicon carbide substrate.

PRIOR ART DOCUMENT

Patent Literature

PTL 1: WO 2015/170500

SUMMARY OF INVENTION

A silicon carbide epitaxial substrate according to the present disclosure includes a silicon carbide substrate and a silicon carbide epitaxial layer. The silicon carbide substrate includes a plurality of screw dislocations. The silicon carbide epitaxial layer is on the silicon carbide substrate. The silicon carbide epitaxial layer has a boundary surface in contact with the silicon carbide substrate and a main surface opposite to the boundary surface. The main surface is a plane tilted relative to a {0001} plane in a first direction. When a recess originating from a first screw dislocation among the plurality of screw dislocations is a first recess, a recess originating from a second screw dislocation among the plurality of screw dislocations is a second recess, an area density of the first recess is a first area density, and an area density of the second recess is a second area density, the first area density is 0.03/cm$^2$ or more, and a value obtained by dividing the second area density by a sum of the first area density and the second area density is 10% or less. As viewed in a direction perpendicular to the main surface, the first recess extends in a straight line along a direction inclined with respect to each of the first direction and a second direction perpendicular to the first direction, and a first-direction-side end portion of the first recess is contiguous to a 4-H polytype region. As viewed in the direction perpendicular to the main surface, the second recess extends in a straight line along a direction inclined with respect to each of the first direction and the second direction, and a first-direction-side end portion of the second recess is contiguous to a 3C polytype region.

A silicon carbide epitaxial substrate according to the present disclosure includes a silicon carbide substrate and a silicon carbide epitaxial layer. The silicon carbide substrate includes a plurality of screw dislocations. The silicon carbide epitaxial layer is on the silicon carbide substrate. The silicon carbide epitaxial layer has a boundary surface in contact with the silicon carbide substrate and a main surface opposite to the boundary surface. The main surface is a plane tilted relative to a {0001} plane in a first direction. When a recess originating from a first screw dislocation among the plurality of screw dislocations is a first recess, a recess originating from a second screw dislocation among the plurality of screw dislocations is a second recess, an area density of the first recess is a first area density, and an area density of the second recess is a second area density, the first area density is 0.03/cm$^2$ or more, and a value obtained by dividing the second area density by a sum of the first area density and the second area density is 10% or less. As viewed in a direction perpendicular to the main surface, the first recess extends in a straight line along a direction inclined with respect to each of the first direction and a second direction perpendicular to the first direction, and a first-direction-side end portion of the first recess is contiguous to a fourth region. As viewed in the direction perpendicular to the main surface, the second recess extends in a straight line along a direction inclined with respect to each of the first direction and the second direction, and a first-direction-side end portion of the second recess is contiguous to a second region. When photoluminescence light generated from the fourth region upon irradiation of the fourth region with excitation light is expressed in RGB color space, R is 161 to 231, G is 224 to 254, and B is 252 to 255. When photoluminescence light generated from the second region upon irradiation of the second region with excitation light is expressed in RGB color space, R is 56 to 115, G is 71 to 128, and B is 56 to 123.

A silicon carbide epitaxial substrate according to the present disclosure includes a silicon carbide substrate and a silicon carbide epitaxial layer. The silicon carbide substrate includes a plurality of screw dislocations. The silicon carbide epitaxial layer is on the silicon carbide substrate. The silicon carbide epitaxial layer has a boundary surface in contact with the silicon carbide substrate and a main surface opposite to the boundary surface. The main surface is a plane tilted relative to a {0001} plane in a first direction. When a recess originating from a first screw dislocation among the plurality of screw dislocations is a first recess, a recess originating from a second screw dislocation among the plurality of screw dislocations is a second recess, an area density of the first recess is a first area density, and an area density of the second recess is a second area density, the first area density is 0.03/cm$^2$ or more, and a value obtained by dividing the second area density by a sum of the first area density and the second area density is 10% or less. As viewed in a direction perpendicular to the main surface, the first recess extends in a straight line along a direction inclined with respect to each of the first direction and a second direction perpendicular to the first direction. As viewed in the direction perpendicular to the main surface, the second recess extends in a straight line along a direction inclined with respect to each of the first direction and the second direction, and a first-direction-side end portion of the second recess is contiguous to an uneven region. The uneven region is located between a first line segment contiguous to the second recess and a second line segment contiguous to the second recess and inclined with respect to the first line segment as viewed in the direction perpendicular to the main surface. The uneven region is spaced apart from the first recess.

A silicon carbide epitaxial substrate according to the present disclosure includes a silicon carbide substrate and a silicon carbide epitaxial layer. The silicon carbide substrate includes a plurality of screw dislocations. The silicon carbide epitaxial layer is on the silicon carbide substrate. The silicon carbide epitaxial layer has a boundary surface in contact with the silicon carbide substrate and a main surface opposite to the boundary surface. The main surface is a plane tilted relative to a {0001} plane in a first direction. When a defect originating from a first screw dislocation among the plurality of screw dislocations is a first defect, a defect originating from a second screw dislocation among the plurality of screw dislocations is a second defect, an area density of the first defect is a first area density, and an area density of the second defect is a second area density, the first area density is $0.03/cm^2$ or more, and a value obtained by dividing the second area density by a sum of the first area density and the second area density is 10% or less. The first defect includes a fourth region that is polygonal and surrounded by a first region as viewed in a direction perpendicular to the main surface. The second defect includes a third region that is polygonal as viewed in the direction perpendicular to the main surface, and a second region in contact with the third region. When photoluminescence light generated from the fourth region upon irradiation of the fourth region with excitation light is expressed in RGB color space, R is 161 to 231, G is 22.4 to 254, and B is 252 to 255. When photoluminescence light generated from the first region upon irradiation of the first region with excitation light is expressed in RGB color space, R is 140 to 180, G is 130 to 190, and B is 130 to 190. When photoluminescence light generated from the second region upon irradiation of the second region with excitation light is expressed in RGB color space, R is 56 to 115, G is 71 to 128, and B is 56 to 123. When photoluminescence light generated from the third region upon irradiation of the third region with excitation light is expressed in RGB color space, R is 161 to 231, G is 224 to 254, and B is 252 to 255.

DETAILED DESCRIPTION

Figure 1:
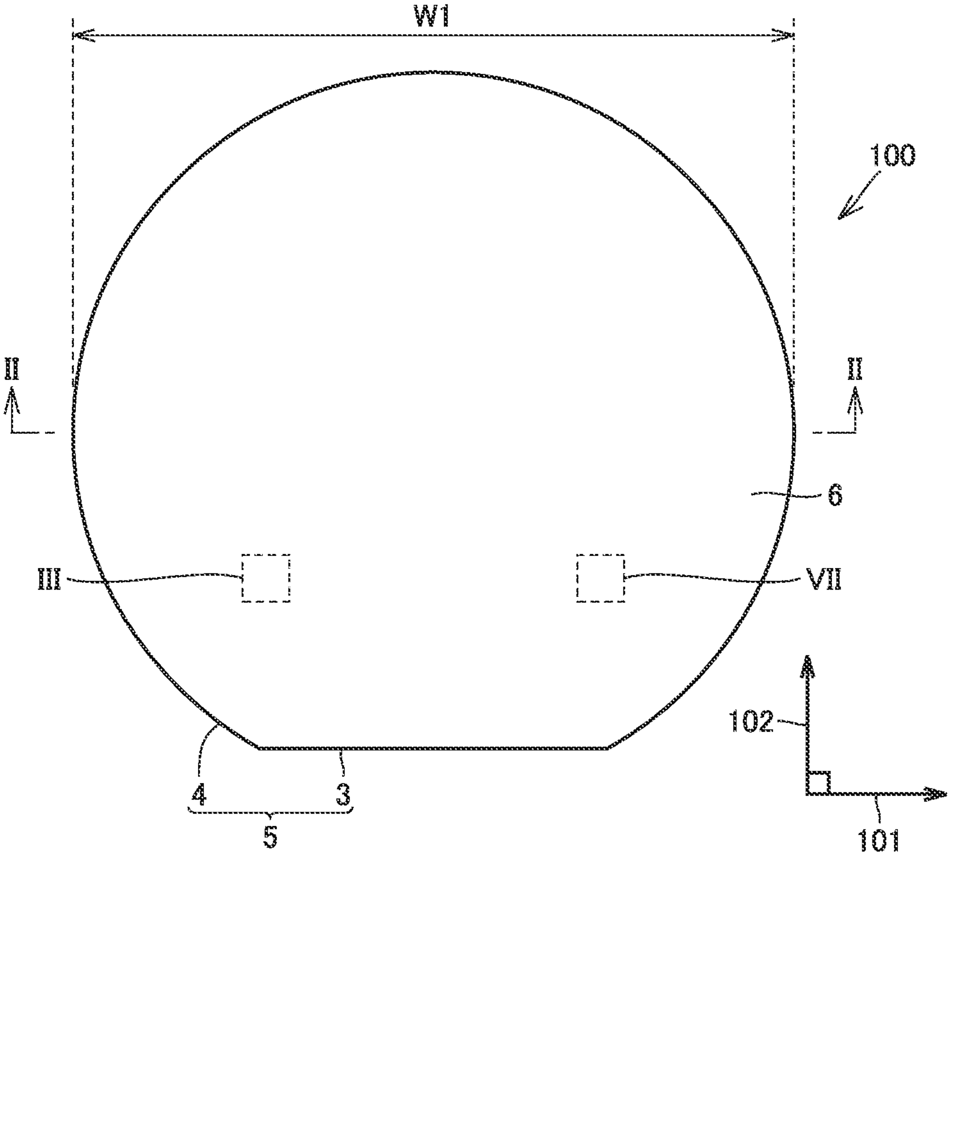
FIG. 1 is a schematic plan view showing a configuration of a silicon carbide epitaxial substrate 100 according to an embodiment of the present disclosure.

Problems to be Solved by the Present Disclosure

It is an object of the present disclosure to provide a silicon carbide epitaxial substrate capable of improving the yield of silicon carbide semiconductor devices.

Effects of the Present Disclosure

According to the present disclosure, it is possible to provide a silicon carbide epitaxial substrate capable of improving the yield of silicon carbide semiconductor devices.

Summary of Embodiments of Present Disclosure

First, an overview of embodiments of the present disclosure will be provided. Regarding crystallographic indications in the present specification, an individual orientation is represented by [ ], a group orientation is represented by < >, an individual plane is represented by ( ), and a group plane is represented by { }. The negative crystallographic index is usually indicated by putting "–" (bar) above a numeral, but the negative crystallographic index is indicated by putting the negative sign before the numeral in the present specification.

(1) A silicon carbide epitaxial substrate 100 according to the present disclosure includes a silicon carbide substrate 30 and a silicon carbide epitaxial layer 40. Silicon carbide substrate 30 includes a plurality of screw dislocations 110. Silicon carbide epitaxial layer 40 is on silicon carbide substrate 30. Silicon carbide epitaxial layer 40 has a boundary surface 7 in contact with silicon carbide substrate 30 and a main surface 6 opposite to boundary surface 7. Main surface 6 is a plane tilted relative to a {0001} plane in a first direction 101. When a recess originating from a first screw dislocation 111 among the plurality of screw dislocations 110 is a first recess 13, a recess originating from second screw dislocation 112 among the plurality of screw dislocations 110 is a second recess 23, an area density of first recess 13 is a first area density, and an area density of second recess 23 is a second area density, the first area density is $0.03/cm^2$ or more, and a value obtained by dividing the second area density by a sum of the first area density and the second area density is 10% or less. As viewed in a direction perpendicular to main surface 6, first recess 13 extends in a straight line along a direction inclined with respect to each of first direction 101 and a second direction 102 perpendicular to first direction 101, and a first-direction-side end portion 11 of first recess 13 is contiguous to a 4H polytype region. As viewed in the direction perpendicular to main surface 6, second recess 23 extends in a straight line along a direction inclined with respect to each of first direction 101 and second direction 102, and a first-direction-side end portion 21 of second recess 23 is contiguous to a 3C polytype region.

(2) A silicon carbide epitaxial substrate 100 according to the present disclosure includes a silicon carbide substrate 30 and a silicon carbide epitaxial layer 40. Silicon carbide substrate 30 includes a plurality of screw dislocations 110. Silicon carbide epitaxial layer 40 is on silicon carbide substrate 30. Silicon carbide epitaxial layer 40 has a boundary surface 7 in contact with silicon carbide substrate 30 and a main surface 6 opposite to boundary surface 7. Main surface 6 is a plane tilted relative to a {0001} plane in a first direction 101. When a recess originating from a first screw dislocation 111 among the plurality of screw dislocations 110 is a first recess 13, a recess originating from a second screw dislocation 112 among the plurality of screw dislocations 110 is a second recess 23, an area density of first recess 13 is a first area density, and an area density of second recess 23 is a second area density, the first area density is $0.03/cm^2$ or more, and a value obtained by dividing the second area density by a sum of the first area density and the second area density is 10% or less. As viewed in a direction perpendicular to main surface 6, first recess 13 extends in a straight line along a direction inclined with respect to each of first direction 101 and second direction 102 perpendicular to first direction 101, and a first-direction-side end portion 11 of first recess 13 is contiguous to a fourth region S4. As viewed in the direction perpendicular to main surface 6, second recess 23 extends in a straight line along a direction inclined with respect to each of first direction 101 and second direction 102, and a first-direction-side end portion 21 of second recess 23 is contiguous to a second region S2. When photoluminescence light generated from fourth region S4 upon irradiation of fourth region S4 with excitation light is expressed in RGB color space, R is 161 to 231, G is 224 to 254, and B is 252 to 255. When photoluminescence light generated from second region S2 upon irradiation of second region S2 with excitation light is expressed in RGB color space, R is 56 to 115, G is 71 to 128, and B is 56 to 123.

(3) A silicon carbide epitaxial substrate 100 according to the present disclosure includes a silicon carbide substrate 30 and a silicon carbide epitaxial layer 40. Silicon carbide substrate 30 includes a plurality of screw dislocations 110. Silicon carbide epitaxial layer 40 is on silicon carbide substrate 30. Silicon carbide epitaxial layer 40 has a boundary surface 7 in contact with silicon carbide substrate 30 and a main surface 6 opposite to boundary surface 7. Main surface 6 is a plane tilted relative to a {0001} plane in a first direction 101. When a recess originating from a first screw dislocation 111 among the plurality of screw dislocations 110 is a first recess 13, a recess originating from a second screw dislocation 112 among the plurality of screw dislocations 110 is a second recess 23, an area density of first recess 13 is a first area density, and an area density of second recess 23 is a second area density, the first area density is $0.03/cm^2$ or more, and a value obtained by dividing the second area density by a sum of the first area density and the second area density is 10% or less. As viewed in a direction perpendicular to main surface 6, first recess 13 extends in a straight line along a direction inclined with respect to each of first direction 101 and a second direction 102 perpendicular to first direction 101. As viewed in the direction perpendicular to main surface 6, second recess 23 extends in a straight line along a direction inclined with respect to each of first direction 101 and second direction 102, and a first-direction-side end portion 21 of second recess 23 is contiguous to an uneven region 34. Uneven region 34 is located between a first line segment 31 contiguous to second recess 23 and a second line segment 32 contiguous to second recess 23 and inclined with respect to first line segment 31 as viewed in the direction perpendicular to main surface 6. Uneven region 34 is spaced apart from first recess 13.

(4) In silicon carbide epitaxial substrate 100 according to any one of (1) to (3) above, in a cross section perpendicular to a direction in which first recess 13 extends, a pair of first projecting portions 15 may be provided beside both sides of first recess 13.

(5) In silicon carbide epitaxial substrate 100 according to any one of (1) to (4) above, in a cross section perpendicular to a direction in which second recess 23 extends, a pair of second projecting portions 25 may be provided beside both sides of second recess 23.

(6) A silicon carbide epitaxial substrate 100 according to the present disclosure includes a silicon carbide substrate 30 and a silicon carbide epitaxial layer 40. Silicon carbide substrate 30 includes a plurality of screw dislocations 110. Silicon carbide epitaxial layer 40 is on silicon carbide substrate 30. Silicon carbide epitaxial layer 40 has a boundary surface 7 in contact with silicon carbide substrate 30 and a main surface 6 opposite to boundary surface 7. Main surface 6 is a plane tilted relative to a {0001} plane in a first direction 101. When a defect originating from first screw dislocation 111 among the plurality of screw dislocations 110 is a first defect 10, a defect originating from second screw dislocation 112 among the plurality of screw dislocations 110 is a second defect 20, an area density of first defect 10 is a first area density, and an area density of second defect 20 is a second area density, the first area density is $0.03/cm^2$ or more, and a value obtained by dividing the second area density by a sum of the first area density and the second area density is 10% or less. First defect 10 includes a fourth region S4 that is polygonal and surrounded by a first region S1 as viewed in a direction perpendicular to main surface 6. Second defect 20 includes a third region S3 that is polygonal as viewed in the direction perpendicular to main surface 6, and a second region S2 in contact with third region S3. When photoluminescence light generated from fourth region S4 upon irradiation of fourth region S4 with excitation light is expressed in RGB color space, R is 161 to 231, (G is 224 to 254, and B is 252 to 255. When photoluminescence light generated from first region S1 upon irradiation of first region S1 with excitation light is expressed in RGB color space, R is 140 to 180, G is 130 to 190, and B is 130 to 190. When photoluminescence light generated from second region S2 upon irradiation of second region S2 with excitation light is expressed in RGB color space, R is 56 to 115, G is 71 to 128, and B is 56 to 123. When photoluminescence light generated from third region S3 upon irradiation of third region S3 with excitation light is expressed in RGB color space, R is 161 to 231, G is 224 to 254, and B is 252 to 255.

DETAILS OF EMBODIMENTS OF THE PRESENT DISCLOSURE

The following is a detailed description of the present disclosure embodiment. In the following description, identical or corresponding elements are provided with the same reference signs and will not be described repeatedly.

(Silicon Carbide Epitaxial Substrate)

Figure 2:
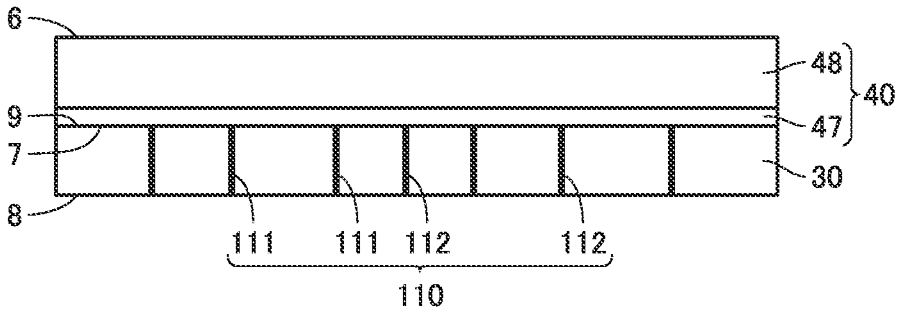
FIG. 2 is a schematic cross-sectional view taken along line II-II of FIG. 1.

FIG. 1 is a schematic plan view showing a configuration of silicon carbide epitaxial substrate 100 according to an embodiment of the present disclosure. FIG. 2 is a schematic cross-sectional view taken along line II-II of FIG. 1. As shown in FIGS. 1 and 2, silicon carbide epitaxial substrate 100 according to an embodiment of the present disclosure includes silicon carbide substrate 30 and silicon carbide epitaxial layer 40. Silicon carbide epitaxial layer 40 is on silicon carbide substrate 30. Silicon carbide epitaxial layer 40 is in contact with silicon carbide substrate 30. Silicon carbide epitaxial layer 40 has first main surface 6 and boundary surface 7. Boundary surface 7 is in contact with silicon carbide substrate 30. First main surface 6 is opposite to boundary surface 7.

Silicon carbide epitaxial layer 40 constitutes a surface (first main surface 6) of silicon carbide epitaxial substrate 100. Silicon carbide substrate 30 constitutes a backside surface (a second main surface 8) of silicon carbide epitaxial substrate 100. As shown in FIG. 1, silicon carbide epitaxial substrate 100 has an outer peripheral edge 5. Outer peripheral edge 5 has, for example, an orientation flat 3 and an arc-shaped portion 4. Orientation flat 3 extends along first direction 101. As shown in FIG. 1, orientation flat 3 is linear as viewed in a direction perpendicular to first main surface 6. Arc-shaped portion 4 is contiguous to orientation flat 3. Arc-shaped portion 4 is arc-shaped as viewed in a direction perpendicular to first main surface 6.

As shown in FIG. 1, as viewed in the direction perpendicular to first main surface 6, first main surface 6 extends along each of first direction 101 and second direction 102. As viewed in a direction perpendicular to first main surface 6, first direction 101 is perpendicular to second direction 102. From another viewpoint, second direction 102 is a direction perpendicular to each of first direction 101 and the normal direction of first main surface 6.

First direction 101 is, for example, <11-20> direction. First direction 101 may be, for example, [11-20] direction. First direction 101 may be may be the projection of the <11-20> direction onto first main surface 6. From another viewpoint, first direction 101 may be, for example, a direction including the <11-20> direction component.

Second direction 102 is, for example, <1-100> direction. Second direction 102 may be, for example, [1-100] direction. Second direction 102 may be, for example, the projection of the <1-100> direction onto first main surface 6. From another viewpoint, second direction 102 may be, for example, a direction including the <1-100> direction component.

First main surface 6 is a plane tilted relative to a {0001} plane in first direction 101, for example. First direction 101 is the off-direction of first main surface 6. From another viewpoint, the off-direction is the inclination direction of first main surface 6. The inclination angle (off angle) with respect to the {0001}r plane is 2° to 6°, for example.

As shown in FIG. 1, a maximum diameter W1 of first main surface 6 is not particularly limited, but is, for example, 100 mm (4 inches). Maximum diameter W1 may be 125 mm (5 inches) or more or 150 mm (6 inches) or more. The upper limit of maximum diameter W1 is not particularly limited. Maximum diameter W1 may be 200 mm (8 inches) or less, for example. Maximum diameter W1 is the maximum distance between any two points on outer peripheral edge 5.

In this specification, 2 inches is 50 mm or 50.8 mm (2 inches 25.4 mm/inch). 4 inches is 100 mm or 101.6 mm (4 inches×25.4 mm/inch). 5 inches is 125 mm or 1270.0 mm (5 inches×254 mm/inch). 6 inches is 150 mm or 152.4 mm (6 inches×25.4 mm/inch). 8 inches is 200 mm or 203.2 mm (8 inches×25.4 mm/inch).

As shown in FIG. 2, silicon carbide substrate 30 includes a plurality of screw dislocations 110. The plurality of screw dislocations 110 includes first screw dislocations 111 and second screw dislocations 112. Silicon carbide substrate 30 has second main surface 8 and a third main surface 9. Third main surface 9 is opposite to second main surface 8. Each of the plurality of screw dislocations 110 is exposed to each of second main surface 8 and third main surface 9. On second main surface 8, the area density of the plurality of screw dislocations 110 is, for example, $100/cm^2$ to $5000/cm^2$.

Second main surface 8 is a backside surface of silicon carbide epitaxial substrate 100. Second main surface 8 is spaced apart from silicon carbide epitaxial layer 40. Third main surface 9 is in contact with silicon carbide epitaxial layer 40. The polytype of silicon carbide constituting silicon carbide substrate 30 is, for example, 4H. Similarly, the polytype of silicon carbide constituting silicon carbide epitaxial layer 40 is, for example, 4H.

As shown in FIG. 2, silicon carbide epitaxial layer 40 includes a buffer layer 47 and a drift layer 48. Drift layer 48 may be one layer or two or more layers. Buffer layer 47 is on silicon carbide substrate 30. Buffer layer 47 is in contact with silicon carbide substrate 30. Drift layer 48 is on buffer layer 47. Drift layer 48 is in contact with buffer layer 47. Drift layer 48 constitutes first main surface 6. Buffer layer 47 constitutes boundary surface 7.

Silicon carbide substrate 30 contains an n-type impurity such as nitrogen (N). The conductivity type of silicon carbide substrate 30 is, for example, n-type. Silicon carbide substrate 30 has a thickness of 200 μm to 500 μm, for example. Silicon carbide epitaxial layer 40 contains an n-type impurity such as nitrogen. The conductivity type of silicon carbide epitaxial layer 40 is, for example, n-type.

The concentration of the n-type impurity contained in buffer layer 47 may be lower than the concentration of the n-type impurity contained in silicon carbide substrate 30. The concentration of the n-type impurity contained in drift layer 48 may be lower than the concentration of the n-type impurity contained in buffer layer 47. The concentration of the n-type impurity contained in drift layer 48 is, for example, about $1\times10^{15}$ $cm^{-3}$ to $1\times10^{17}$ $cm^{-3}$. The concentration of the n-type impurity contained in buffer layer 47 is, for example, about $1\times10^{18}$ $cm^{-3}$.

Figure 3:
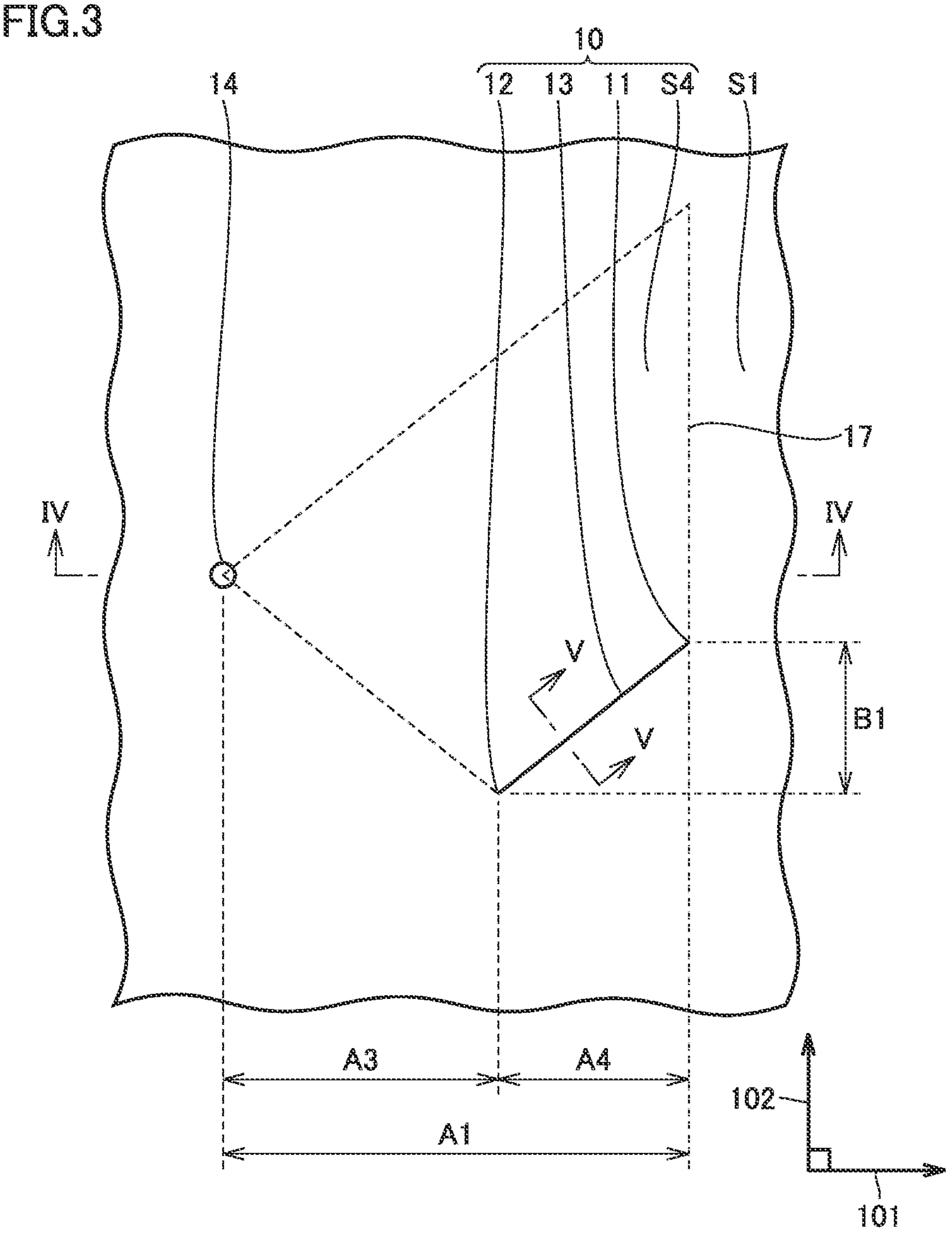
FIG. 3 is an enlarged plan view of region III of FIG. 1.

FIG. 3 is an enlarged plan view of region III of FIG. 1. As shown in FIG. 3, first main surface 6 has first defect 10. First defect 10 is a defect originating from first screw dislocation 111 among the plurality of screw dislocations 110. First defect 10 has fourth region S4 and first recess 13. First region S1 includes a first stacking fault 1 (see FIG. 4). As shown in FIG. 3, as viewed in the direction perpendicular to first main surface 6, first recess 13 extends in a straight line along a direction inclined with respect to each of first direction 101 and second direction 102. For example, first recess 13 may extend along a direction in which first direction 10*l* is inclined toward second direction 102.

Figure 4:
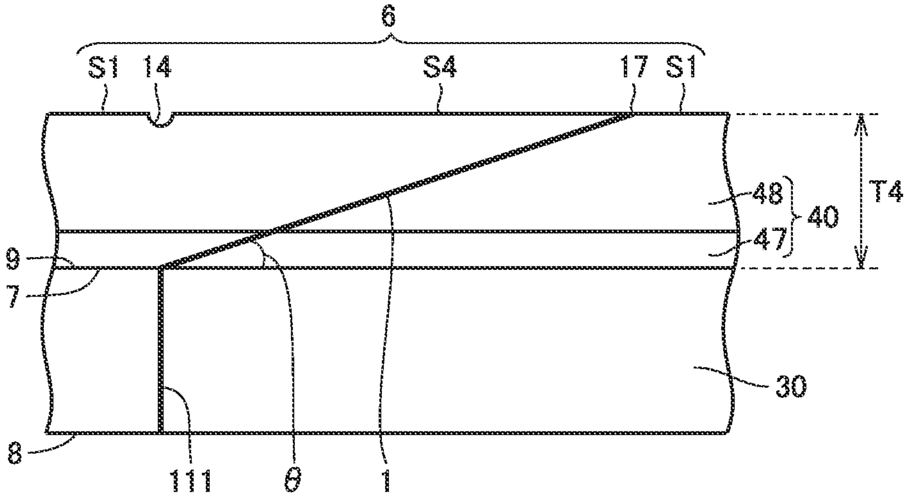
FIG. 4 is a schematic cross-sectional view taken along line IV-IV of FIG. 3.

FIG. 4 is a schematic cross-sectional view taken along line IV-IV of FIG. 3. The cross section shown in FIG. 4 is perpendicular to first main surface 6 and parallel to first direction 101. As shown in FIG. 4, silicon carbide epitaxial layer 40 has first stacking fault 1 located on the basal plane. Silicon carbide substrate 30 has first screw dislocation 111. First stacking fault 1 grows along a direction obtained by projecting first direction 101 from first screw dislocation 111 onto the basal plane. The angle formed by first stacking fault 1 and third main surface 9 is off angle θ.

As shown in FIG. 4, one end of first stacking fault 1 is contiguous to first screw dislocation 111. The other end of first stacking fault 1 is exposed on first main surface 6. First stacking fault 1 extends continuously from third main surface 9 to first main surface 6. First main surface 6 is provided with a first pit 14. First pit 14 may be located at an intersection of a straight line along first screw dislocation 111 and first main surface 6.

First recess 13 is a recess originating from first screw dislocation 111 among the plurality of screw dislocations 110. First recess 13 is contiguous to first region S1. First recess 13 may be contiguous to first stacking fault 1. As shown in FIG. 3, first recess 13 has first end portion 11 (first-direction-side end portion 11) and a second end portion 12. First end portion 11 is located on first direction 101 side in first recess 13. Second end portion 12 is opposite to first end portion 11. Second end portion 12 is opposite to first direction 101 in first recess 13.

From another viewpoint, in first direction 101, second end portion 12 is located between first end portion 11 and first pit 14. First end portion 11 (first-direction-side end portion 11) of first recess 13 is contiguous to first region S1. First region S1 is a region of a 4H polytype. First region S1 is a non-defect region. Second end portion 12 of first recess 13 may be contiguous to first region S1. The fourth region is a region of the 4H polytype. Fourth region S4 is a non-defect region. First recess 13 may be located at a boundary between fourth region S4 and first region S1.

As shown in FIGS. 3 and 4, when the thickness of silicon carbide epitaxial layer 40 is a fourth thickness T4 and the off angle of silicon carbide epitaxial substrate 100 is off angle θ, the length of first stacking fault 1 (a first length A1) in first direction 101 is about T4/tan θ.

As shown in FIG. 4, a first base 17 of fourth region S4 is contiguous to first stacking fault 1 on first main surface 6. As shown in FIG. 3, in the direction along first direction 101, fourth region S4 is located between first pit 14 and first base 17. As viewed in the direction perpendicular to first main surface 6, first base 17 extends along second direction 102.

As shown in FIG. 3, as viewed in the direction perpendicular to first main surface 6, a length between first pit 14 and second end portion 12 along first direction 101 is a third length A3. Third length A3 is shorter than first length A1. As viewed in the direction perpendicular to first main surface 6, a length between first pit 14 and first end portion 11 along first direction 101 is first length A1.

As shown in FIG. 3, as viewed in the direction perpendicular to first main surface 6, the length of first recess 13 along first direction 101 is a fourth length A4. Fourth length A4 is shorter than first length A1 Third length A3 may be longer than fourth length A4 or may be shorter than fourth length A4. As viewed in the direction perpendicular to first main surface 6, a length of first recess 13 along second direction 102 is an eighth length B1. Eighth length B1 may be shorter than fourth length A4 or may be longer than fourth length A4.

Figure 5:
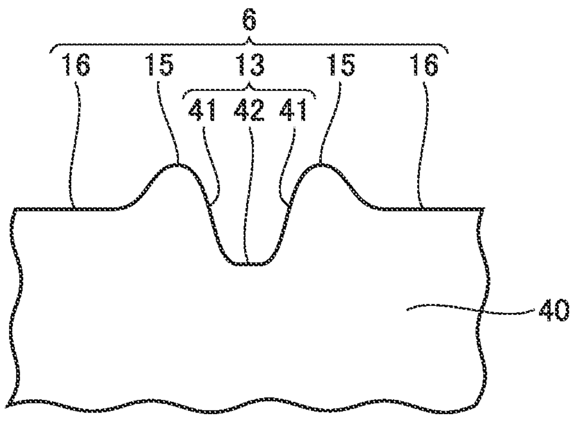
FIG. 5 is a schematic cross-sectional view taken along line V-V of FIG. 3.

FIG. 5 is a schematic cross-sectional view taken along line V-V of FIG. 3. The cross section shown in FIG. 5 is perpendicular to the direction in which first recess 13 extends. As shown in FIG. 5, in a cross section perpendicular to the direction in which first recess 13 extends, a pair of first projecting portions 15 may be provided beside both sides of first recess 13. First recess 13 is defined by a pair of a first side surfaces 41 and a first bottom surface 42. First bottom surface 42 is contiguous to each of the pair of first side surfaces 41. First side surface 41 is contiguous to first projecting portion 15.

As shown in FIG. 5, first main surface 6 has a first upper surface 16. In the thickness direction of silicon carbide epitaxial layer 40, the apex of each of the pair of first projecting portions 15 is located higher than first upper surface 16. In the thickness direction of silicon carbide epitaxial layer 40, first bottom surface 42 is lower than first upper surface 16. From another viewpoint, in the thickness direction of silicon carbide epitaxial layer 40, first tipper surface 16 is located between the top of each of the pair of first projecting portions 15 and first bottom surface 42.

Figure 6:
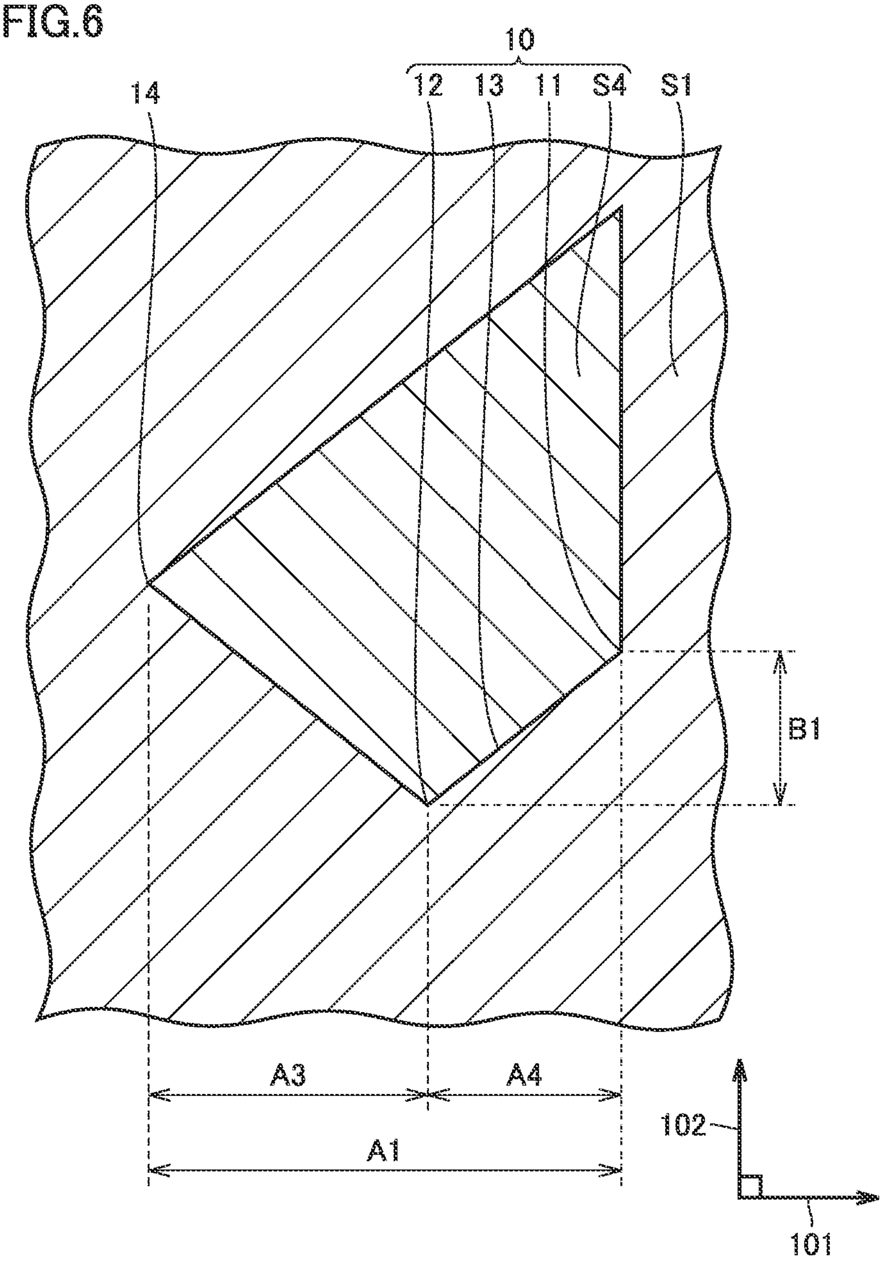
FIG. 6 is a schematic diagram showing a first defect shown in a color image obtained from a color image sensor.

FIG. 6 is a schematic diagram showing first defect 10 shown in a color image obtained from a color image sensor. In the schematic diagram shown in FIG. 6, the color of first region S1 is different from the color of fourth region S4. Fourth region S4 is a region having first defect 10. First region S1 is a region having no first defect 10. As viewed in the direction perpendicular to first main surface 6, fourth region S4 is surrounded by first region S1. The color of fourth region S4 is, for example, purple. The color of first region S1 is, for example, gray. As viewed in the direction perpendicular to first main surface 6, first defect 10 is polygonal. The shape of the polygon is not particularly limited, and may be, for example, a quadrangle, a pentagon, or a hexagon.

The color of fourth region S4 (first defect 10) can be expressed in RGB color space. Specifically, when photoluminescence light generated from fourth region S4 (first defect 10) upon irradiation of fourth region S4 (first defect 10) with excitation light is expressed in RGB color space, R is 161 to 231, G is 224 to 254, and B is 252 to 255.

The color of first region S1 can be expressed in RGB color space. Specifically, when photoluminescence light generated from first region S1 upon irradiation of first region S1 with excitation light is expressed in RGB color space, R is 140 to 180, G is 130 to 190, and B is 130 to 190.

Figure 7:
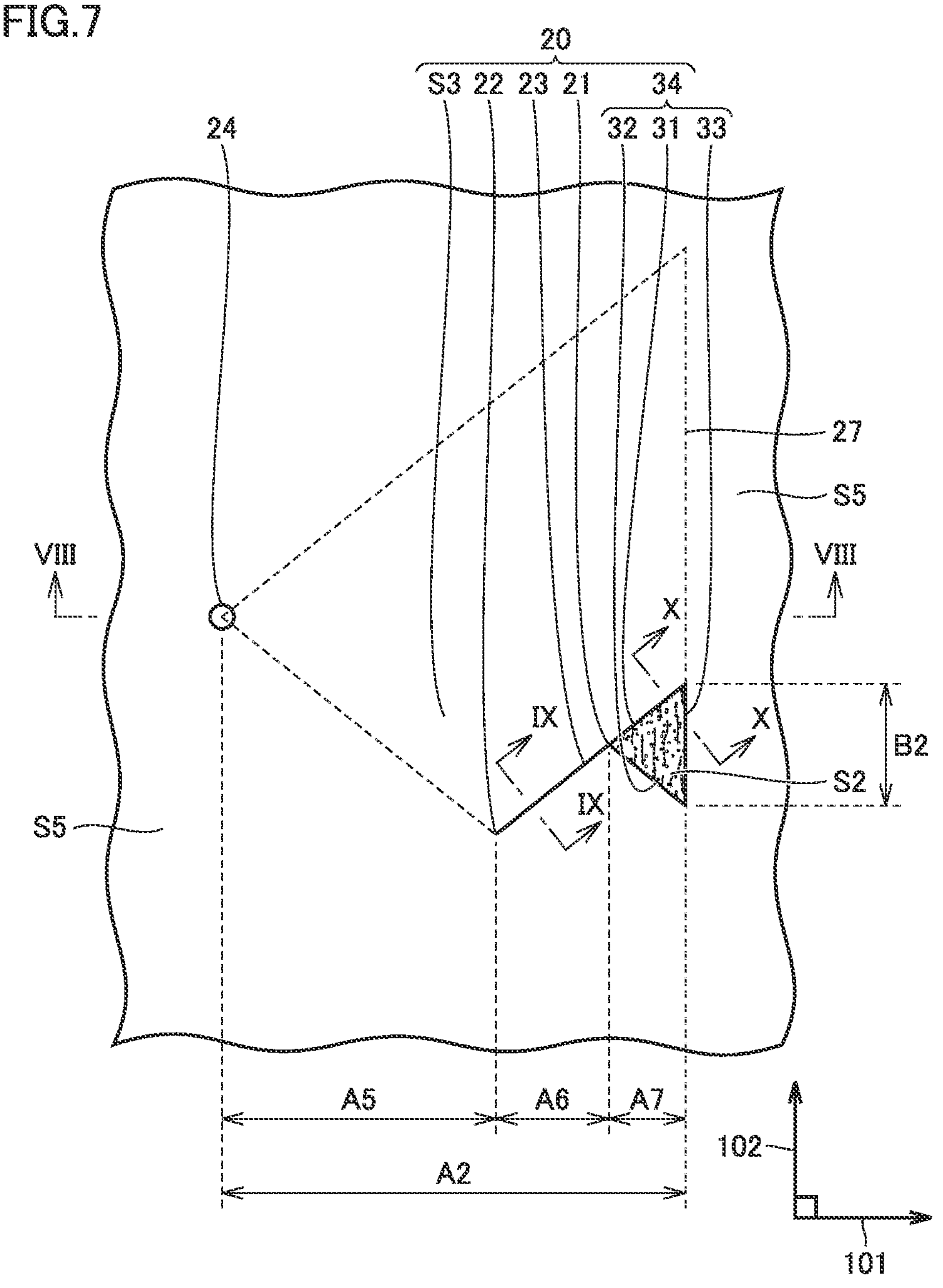
FIG. 7 is an enlarged plan view of region VII of FIG. 1.

FIG. 7 is an enlarged plan view of region VII of FIG. 1. As shown in FIG. 7, first main surface 6 may have second defect 20. Second defect 20 is a defect originating from second screw dislocation 112 among the plurality of screw dislocations 110. Second defect 20 has second region S2, third region S3, and second recess 23. Third region S3 includes a second stacking fault 2 (see FIG. 8). As shown in FIG. 7, as viewed in the direction perpendicular to first main surface 6, second recess 23 extends in a straight line along a direction inclined with respect to each of first direction 101 and second direction 102. For example, second recess 23 may extend along a direction in which first direction 101 is inclined toward second direction 102.

Figure 8:
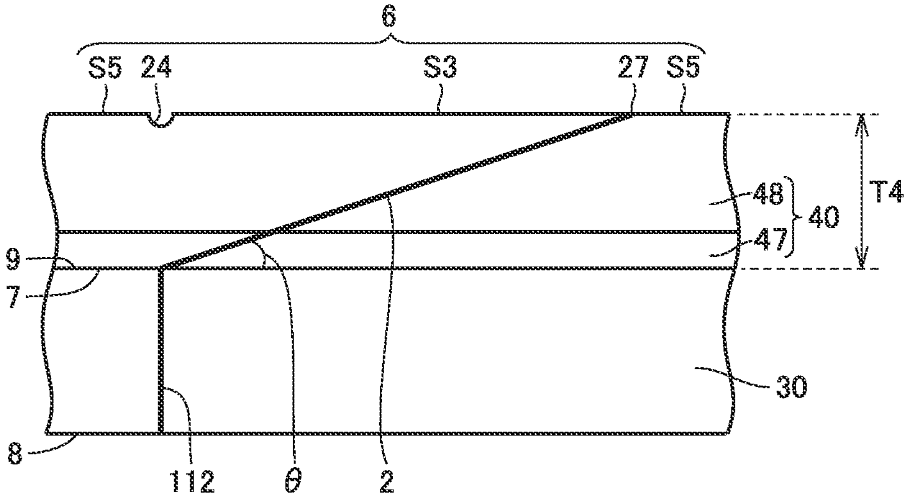
FIG. 8 is a schematic cross-sectional view taken along line VIII-VIII of FIG. 7.

FIG. 8 is a schematic cross-sectional view taken along line VIII-VIII of FIG. 7. The cross section shown in FIG. 8 is perpendicular to first main surface 6 and parallel to first direction 101. As shown in FIG. 8, silicon carbide epitaxial layer 40 has second stacking fault 2 located on the basal plane. Silicon carbide substrate 30 has second screw dislocation 112. Second stacking fault 2 grows along a direction obtained by projecting first direction 101 from second screw dislocation 112 onto the basal plane. The angle formed by second stacking fault 2 and third main surface 9 is off angle θ.

As shown in FIG. 8, one end of second stacking fault 2 is contiguous to second screw dislocation 112. The other end of second stacking fault 2 is exposed on first main surface 6. Second stacking fault 2 extends continuously from third main surface 9 to first main surface 6. A second pit 24 is provided on first main surface 6. Second pit 24 may be located at an intersection of a straight line along second screw dislocation 112 and first main surface 6.

Second recess 23 is a recess originating from second screw dislocation 112 among the plurality of screw dislocations 110. Second recess 23 may be contiguous to second stacking fault 2. As shown in FIG. 7, second recess 23 has third end portion 21 (first-direction-side end portion 21) and a fourth end portion 22. Third end portion 21 is located on first direction 101 side in second recess 23. Fourth end portion 22 is opposite to third end portion 21. Fourth end portion 22 is opposite to first direction 101 in second recess 23.

From another viewpoint, in first direction 101, fourth end portion 22 is located between third end portion 21 and second pit 24. Third end portion 21 (first-direction-side end portion 21) of second recess 23 is contiguous to second region S2. Second region S2 is a region of a 3C polytype. Second region S2 is a defect region. Fourth end portion 22 of second recess 23 may be contiguous to a fifth region S5. Fifth region S5 is a non-defect region. Second recess 23 may be located at the boundary between fifth region S5 and third region S3.

Second region S2 is uneven region 34. Third end portion 21 (first-direction-side end portion 21) of second recess 23 is contiguous to uneven region 34. Uneven region 34 is located between first line segment 31 and second line segment 32. Uneven region 34 is, for example, a region surrounded by first line segment 31, second line segment 32, and a third line segment 33. First line segment 31 is contiguous to second recess 23. Specifically, first line segment 31 is contiguous to third end portion 21 of second recess 23. First line segment 31 may extend along a direction in which second recess 23 extends, or may extend along a direction inclined with respect to the direction in which second recess 23 extends.

Second line segment 32 is inclined with respect to first line segment 31 as viewed in the direction perpendicular to first main surface 6. Second line segment 32 is contiguous to second recess 23. Specifically, second line segment 32 is contiguous to third end portion 21 of second recess 23. Second line segment 32 is in contact with first line segment 31 at third end portion 21. For example, first line segment 31 is inclined toward second direction 102 with respect to first direction 101. For example, second line segment 32 is inclined opposite to second direction 102 with respect to first direction 101.

Third line segment 33 is contiguous to each of first line segment 31 and second line segment 32. Third line segment 33 is spaced apart from third end portion 21. As viewed in the direction perpendicular to first main surface 6, third line segment 33 extends, for example, in a direction parallel to second direction 102. Uneven region 34 is not contiguous to first recess 13. In other words, uneven region 34 is spaced apart from first recess 13.

As shown in FIGS. 7 and 8, when the thickness of silicon carbide epitaxial layer 40 is fourth thickness T4 and the off angle is off angle θ, the length of second stacking fault 2 (a second length A2) in first direction 101 is about T4/tan θ. As shown in FIG. 7, as viewed in the direction perpendicular to first main surface 6, the length between second pit 24 and fourth end portion 22 along first direction 101 is a fifth length A5. Fifth length A5 is shorter than second length A2.

As shown in FIG. 8, a second base 27 of third region S3 is contiguous to second stacking fault 2 on first main surface 6. As shown in FIG. 7, in the direction along first direction 101, third region S3 is located between second pit 24 and second base 27. As viewed in the direction perpendicular to first main surface 6, second base 27 extends along second direction 102. Second base 27 is contiguous to each of first line segment 31 and third line segment 33.

As shown in FIG. 7, as viewed in the direction perpendicular to first main surface 6, the length of second recess 23 along first direction 101 is a sixth length A6. Sixth length A6 is shorter than second length A2. Sixth length A6 may be longer than fifth length A5 or may be shorter than fifth length A5. As viewed in the direction perpendicular to first main surface 6, the length of second region S2 along first direction 101 is a seventh length A7. Seventh length A7 may be shorter than sixth length A6 or may be longer than sixth length A6. As viewed in the direction perpendicular to first main surface 6, the length of second region S2 along second direction 102 is a ninth length B2. Ninth length B2 may be longer than seventh length A7 or may be shorter than seventh length A7.

Figure 9:
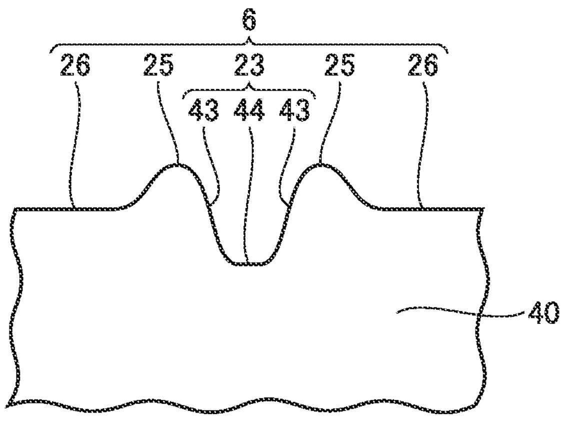
FIG. 9 is a schematic cross-sectional view taken along line IX-IX of FIG. 7.

FIG. 9 is a schematic cross-sectional view taken along line IX-IX of FIG. 7. The cross section shown in FIG. 9 is perpendicular to the direction in which second recess 23 extends. As shown in FIG. 9, in a cross section perpendicular to the direction in which second recess 23 extends, a pair of second projecting portions 25 may be provided beside both sides of second recess 23. Second recess 23 is defined by a pair of a second side surfaces 43 and a second bottom surface 44. Second bottom surface 44 is contiguous to each of the pair of second side surfaces 43. Second side surface 43 is contiguous to second projecting portion 25.

As shown in FIG. 9, first main surface 6 has a second upper surface 26. In the thickness direction of silicon carbide epitaxial layer 40, the apex of each of the pair of second projecting portions 25 is located higher than second upper surface 26. In the thickness direction of silicon carbide epitaxial layer 40, second bottom surface 44 is lower than second upper surface 26. From another viewpoint, in the thickness direction of silicon carbide epitaxial layer 40, second upper surface 26 is located between the top of each of the pair of second projecting portions 25 and second bottom surface 44.

Figure 10:
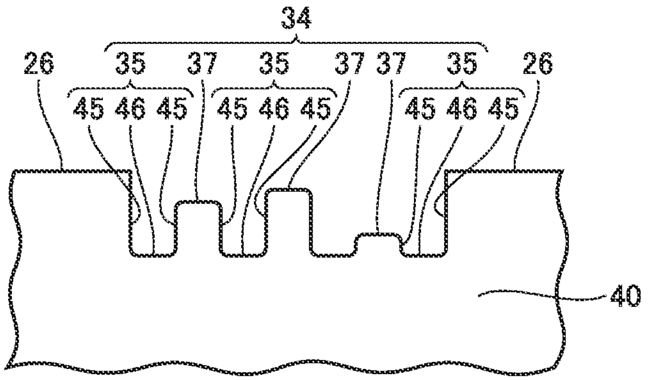
FIG. 10 is a schematic cross-sectional view taken along line X-X of FIG. 7.

FIG. 10 is a schematic cross-sectional view taken along line X-X of FIG. 7. The cross section shown in FIG. 10 is perpendicular to the direction in which second recess 23 extends and intersects uneven region 34. As shown in FIG. 10, uneven region 34 is a region formed by alternately arranging a recess and a projecting portion. Uneven region 34 is formed, for example, by alternately arranging a third recess 35 and a third projecting portion 37. Third recess 35 is defined by a pair of a third side surfaces 45 and a third bottom surface 46. Third bottom surface 46 is contiguous to each of the pair of third side surfaces 45. At least one of the pair of third side surfaces 45 is contiguous to third projecting portion 37. One of the pair of third side surfaces 45 may be contiguous to second upper surface 26.

As shown in FIG. 10, each apex of third projecting portions 37 may be lower than second upper surface 26 in the thickness direction of silicon carbide epitaxial layer 40. In the thickness direction of silicon carbide epitaxial layer 40, third bottom surface 46 is lower than second upper surface 26. From another viewpoint, the apex of third projecting portion 37 may be located between second upper surface 26 and third bottom surface 46 in the thickness direction of silicon carbide epitaxial layer 40. The number of third projecting portions 37 is not particularly limited, and may be, for example, three or more, five or more, or ten or more.

Figure 11:
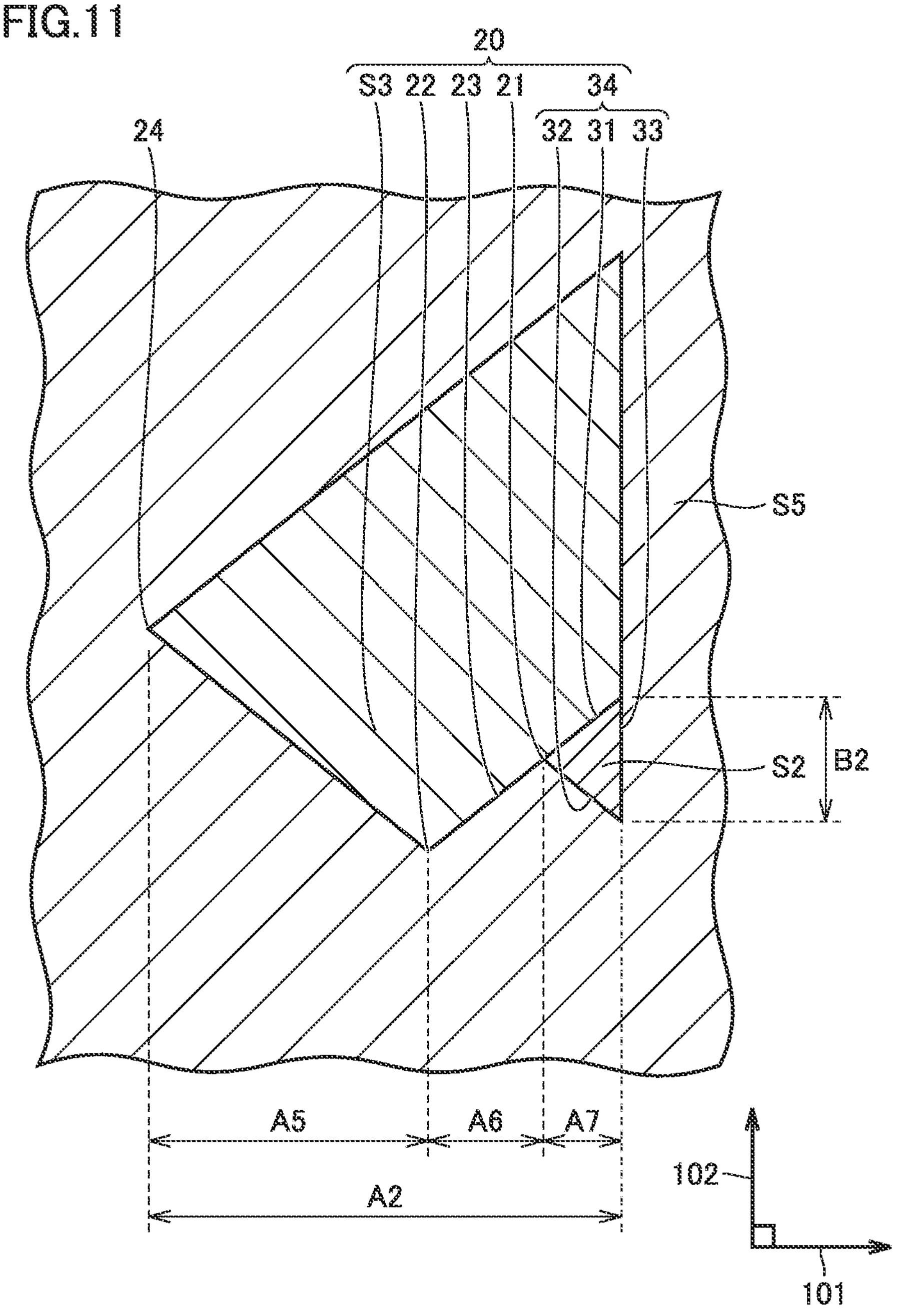
FIG. 11 is a schematic diagram showing a second defect shown in a color image obtained from a color image sensor.

FIG. 11 is a schematic diagram showing second defect 20 shown in a color image obtained from a color image sensor. In the schematic diagram shown in FIG. 11, the color of second region S2, the color of third region S3, and the color of fifth region S5 are different from each other. Second region S2 and third region 83 are regions having second defect 20. Fifth region S5 is a region having no second defect 20. The color of second region S2 is, for example, black. The color of third region S3 is, for example, purple. The color of fifth region S5 is, for example, gray. The color of third region S3 may be the same as the color of fourth region S4. The color of fifth region S5 may be the same as the color of first region S1.

Second defect 20 includes third region S3 and second region S2. Second region S2 is in contact with third region S3. As viewed in the direction perpendicular to first main surface 6, third region S3 is polygonal. The shape of the polygon is not particularly limited, and may be, for example, a quadrangle, a pentagon, or a hexagon. As viewed in the direction perpendicular to first main surface 6, second region S2 is, for example, triangular. As shown in FIG. 11, one side of triangular second region S2 may constitute a part of one side of polygonal third region S3.

The color of second region S2 can be expressed in RGB color space. Specifically, when photoluminescence light generated from second region S2 upon irradiation of second region S2 with excitation light is expressed in RGB color space, R is 56 to 115, G is 71 to 128, and B is 56 to 123.

The color of third region S3 can be expressed in RGB color space. Specifically, when photoluminescence light generated from third region S3 upon irradiation of third region S3 with excitation light is expressed in RGB color space, R is 161 to 231, G is 224 to 254, and 13 is 252 to 255.

The color of fifth region S5 can be expressed in RGB color space. Specifically, when photoluminescence light generated from fifth region S5 upon irradiation of fifth region S3 with excitation light is expressed in RGB color space, R is 140 to 180, G is 130 to 190, and B is 130 to 190.

Next, the configuration of modification of second defect 20 will be described. The modification of second defect 20 is different from the above-described second defect 20 in second recess 23 extends along a direction inclined opposite to second direction 102 with respect to first direction 101, and other configurations are the same as those of the above-described second defect 20. Hereinafter, a configuration different from that of second defect 20 will be mainly described.

Figure 12:
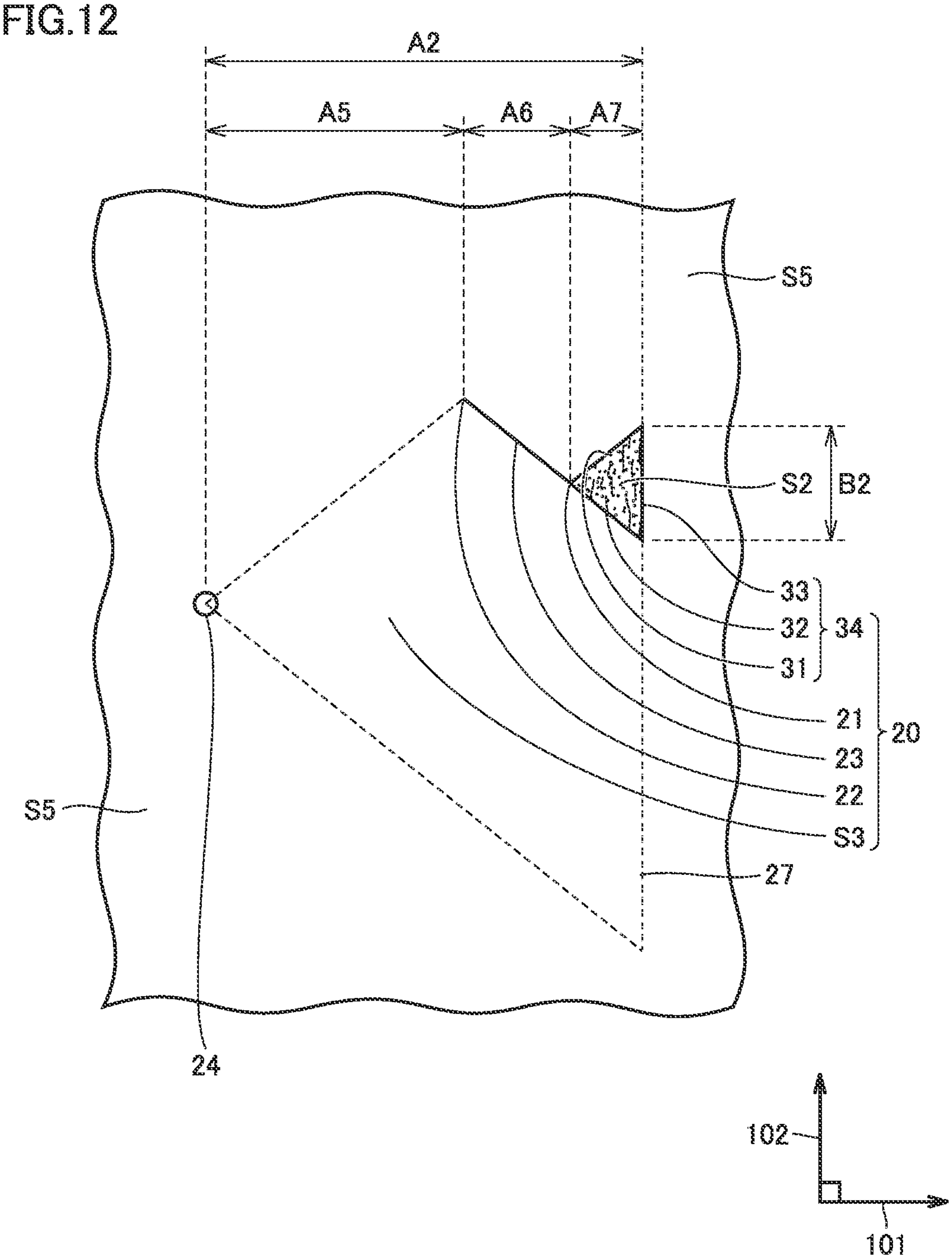
FIG. 12 is an enlarged schematic plan view showing a configuration of modification of a second defect.

FIG. 12 is an enlarged schematic plan view showing a configuration of modification of second defect 20. The region of FIG. 12 corresponds to the region of FIG. 7. As shown in FIG. 12, as viewed in the direction perpendicular to first main surface 6, second recess 23 may extend along a direction inclined with respect to first direction 101 in a direction opposite to second direction 102. From another viewpoint, as viewed in the direction perpendicular to first main surface 6, second recess 23 may extend along a direction inclined opposite to second direction 102 with respect to first direction 101.

As shown in FIG. 12, uneven region 34 is located between first line segment 31 and second line segment 32. As viewed in the direction perpendicular to first main surface 6, first line segment 31 may extend along a direction inclined with respect to a direction in which second recess 23 extends. Second line segment 32 may extend along the direction in which second recess 23 extends. First line segment 31 is inclined with respect to second line segment 32. For example, first line segment 31 is inclined toward second direction 102 with respect to first direction 101. For example, second line segment 32 is inclined opposite to second direction 102 with respect to first direction 101.

Next, the area density of first recess 13 and the area density of second recess 23 in silicon carbide epitaxial substrate 100 according to the embodiment of the present disclosure will be described.

In silicon carbide epitaxial substrate 100 according to the embodiment of the present disclosure, when the area density of first recess 13 is a first recess area density and the area density of second recess 23 is a second recess area density, the first recess area density is 0.03/cm$^2$ or more, and the value obtained by dividing the second recess area density by the sum of the first recess area density and the second recess area density is 10% or less.

The lower limit of the first recess area density is not particularly limited, and may be, for example, 0.10/cm$^2$ or more or 1.00/cm$^2$ or more. The upper limit of the first recess area density is not particularly limited, and may be, for example, 5.00/cm$^2$ or less or 3.00/cm$^2$ or less.

The second recess area density may be, for example, 0. From another viewpoint, second recess 23 may not be present in first main surface 6. The lower limit of the second recess area density is not particularly limited, and may be, for example, 0.10/cm$^2$ or more or 1.00/cm$^2$ or more. The upper limit of the second recess area density is not particularly limited, and may be, for example, 5.00/cm$^2$ or less or 3.00/cm$^2$ or less.

The value obtained by dividing the second recess area density by the sum of the first recess area density and the second recess area density may be, for example, 0. The lower limit of the value obtained by dividing the second recess area density by the sum of the first recess area density and the second recess area density is not particularly limited, and may be, for example, 1% or more or 2% or more. The upper limit of the value obtained by dividing the second recess area density by the sum of the first recess area density and the second recess area density is not particularly limited, and may be, for example, 8% or less or 6% or less.

Next, the area density of first defect 10 and the area density of second defect 20 in silicon carbide epitaxial substrate 100 according to the embodiment of the present disclosure will be described.

In silicon carbide epitaxial substrate 100 according to the embodiment of the present disclosure, when the area density of first defect 10 is a first defect area density and the area density of second defect 20 is a second defect area density, the first defect area density is 0.03/cm$^2$ or more and the value obtained by dividing the second defect area density by the sum of the first defect area density and the second defect area density is 10% or less.

The lower limit of the first defect area density is not particularly limited, and may be, for example, 0.10/cm$^2$ or more or 1.00/cm$^2$ or more. The upper limit of the first defect area density is not particularly limited, and may be, for example, 5.00/cm$^2$ or less or 3.00/cm$^2$ or less.

The second defect area density may be, for example, 0. From another viewpoint, second defect 20 may not be present in first main surface 6. The lower limit of the second defect area density is not particularly limited, and may be, for example, 0.10/cm$^2$ or more or 1.00/cm$^2$ or more. The upper limit of the second defect area density is not particularly limited, and may be, for example, 5.00/cm$^2$ or less or 3.00/cm$^2$ or less.

The value obtained by dividing the second defect area density by the sum of the first defect area density and the second defect area density may be, for example, 0. The lower limit of the value obtained by dividing the second defect area density by the sum of the first defect area density and the second defect area density is not particularly limited, and may be, for example, 1% or more or 2% or more. The upper limit of the value obtained by dividing the second defect area density by the sum of the first defect area density and the second defect area density is not particularly limited, and may be, for example, 8% or less or 6% or less.

Next, a method for specifying each of first recess 13 and second recess 23 will be described. Each of first recess 13 and second recess 23 is identified by observing first main surface 6 of silicon carbide epitaxial substrate 100 using a defect inspection apparatus having a confocal differential interference microscope. For example, WASAVI series "SICA 6X" manufactured by Lasertec corporation can be used as a defect inspection apparatus having a confocal differential interference microscope. The magnification of the objective lens is, for example, ten times. First main surface 6 of silicon carbide epitaxial substrate 100 is irradiated with light having a wavelength 546 nm from a light source such as a mercury-xenon lamp, and the reflection light of the light is observed by a light receiving device.

Each of first recess 13 and second recess 23 is defined in consideration of a planar shape of each of first recess 13 and second recess 23. Specifically, a recess where first-direction-side end portion 21 is contiguous to uneven region 34 is defined as second recess 23. A recess in which first-direction-side end portion 11 is not contiguous to uneven region 34 is defined as first recess 13. As viewed in a direction perpendicular to first main surface 6, first recess 13 and second recess 23 each extend in a straight line. In each of first recess 13 and second recess 23, a value (aspect ratio) obtained by dividing the length of the recess in the extending direction by the width of the recess in the direction perpendicular to the extending direction is ten or more. Based on the observed image, each of first recess 13 and second recess 23 is specified. "Thresh S" which is an index of the measurement sensitivity of SICA is 40, for example.

While moving silicon carbide epitaxial substrate 100 in a direction parallel to first main surface 6, a confocal differential interference contrast microscope image of entire first main surface 6 is captured. In the acquired confocal differential interference contrast microscope image, the area density of each of first recess 13 and second recess 23 is obtained. Specifically, a value obtained by dividing the number of first recesses 13 by the observation area of first main surface 6 is the area density of first recesses 13. Similarly, a value obtained by dividing the number of second recesses 23 by the observation area of first main surface 6 is the area density of second recesses 23.

Next, a configuration of a photoluminescence imaging apparatus for specifying each of first defect 10 and second defect 20 will be described.

Figure 13:
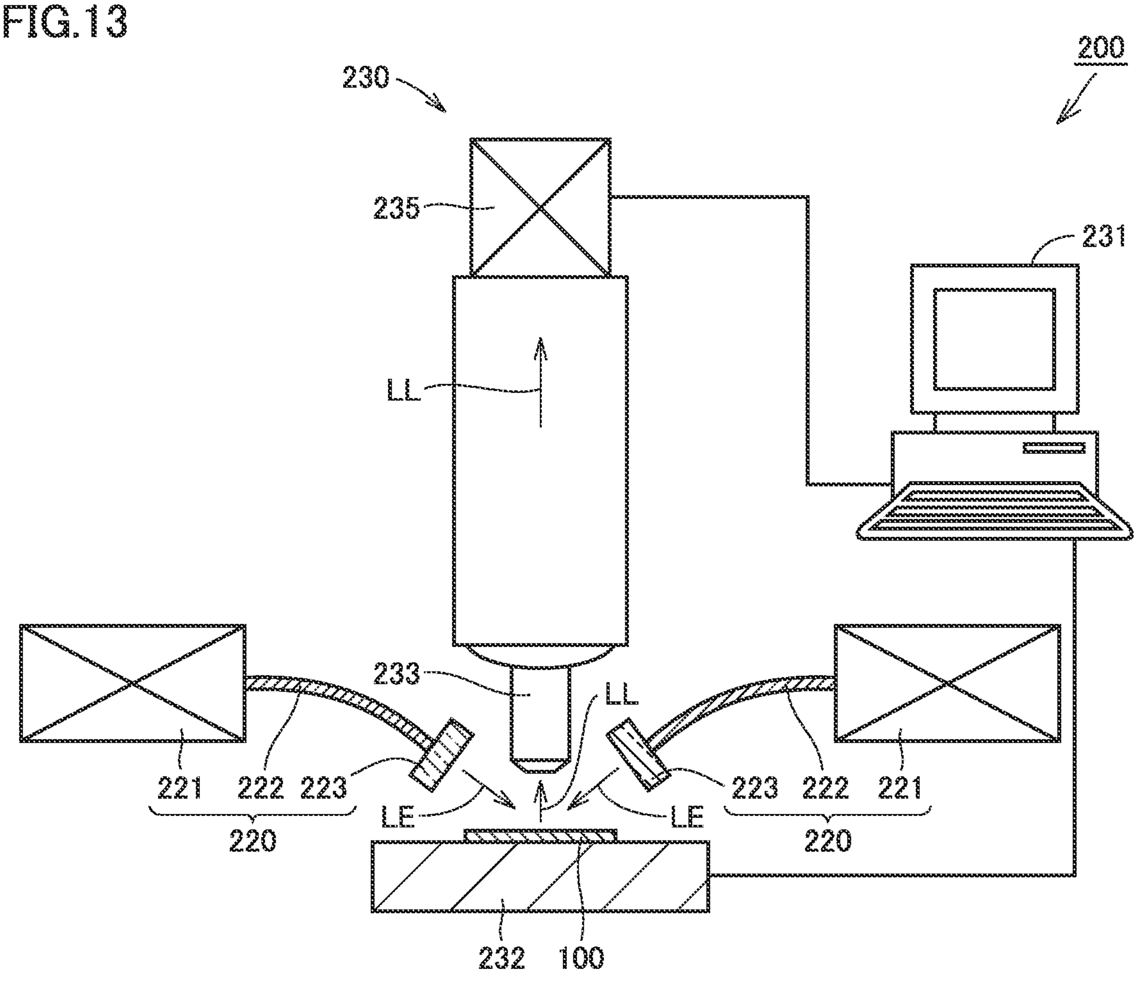
FIG. 13 is a schematic diagram showing a configuration of a photoluminescence imaging apparatus.

FIG. 13 is a schematic diagram showing a configuration of a photoluminescence imaging apparatus. As shown in FIG. 13, a photoluminescence imaging apparatus 200 mainly includes excitation light generation units 220 and an imaging unit 230.

Excitation light generation unit 220 includes a light source 221, a light guide 222, and a filter 223. Light source 221 can generate an excitation light LE having energy higher than the band gap of hexagonal silicon carbide. Light source 221 is, for example, a mercury xenon lamp. Light guide 222 can guide light emitted from light source 221 such that the light is irradiated onto first main surface 6 of silicon carbide epitaxial substrate 100. Light guide 222 includes, for example, an optical fiber. As shown in FIG. 9, excitation light generation unit 220 may be located on both sides of a near-infrared objective lens 233.

Filter 223 selectively transmits light having a specific wavelength corresponding to energy higher than the band gap of hexagonal silicon carbide. Wavelengths corresponding to the band gap of hexagonal silicon carbide are typically about 390 nm. Thus, for example, a band-pass filter is used as filter 223, which in particular transmits light having wavelengths of approximately 313 nm. The transmission waveband of filter 223 may be, for example, 290 nm to 370 nm, 300 nm to 330 nm, 300 nm to 320 nm.

Imaging unit 230 mainly includes a controller 231, a stage 232, near-infrared objective lens 233, and a color image sensor 235. Controller 231 controls a displacement operation of stage 232 and a photographing operation by color image sensor 235, and is, for example, a personal computer. Stage 232 supports silicon carbide epitaxial substrate 100 such that first main surface 6 is exposed. Stage 232 is, for example, an XY stage that displaces the position of first main surface 6. Near-infrared objective lens 233 is disposed above first main surface 6. The magnification of near-infrared objective lens 233 is, for example, 4.5 times. Color image sensor 235 receives a photoluminescence light LL emitted from silicon carbide epitaxial substrate 100.

Next, a method for specifying first defect 10 and second defect 20 will be described. First, excitation light LE is irradiated to first main surface 6 of silicon carbide epitaxial substrate 100 using excitation light generation unit 220. Accordingly, photoluminescence light LL is generated from silicon carbide epitaxial substrate 100. The wavelength of excitation light LE is, for example, 313 nm. The intensity of excitation light LE is, for example, 0.1 mW/cm$^2$ to 2 W/cm$^2$. The exposure time of the irradiation light is 0.5 seconds to 120 seconds, for example.

Next, photoluminescence light is detected by the color image sensor. Specifically, photoluminescence light LL generated from silicon carbide epitaxial substrate 100 is detected by color image sensor 235. Color image sensor 235 is, for example, a charge-coupled device (CCD) image sensor. The type of the CCD is, for example, a back-illuminated deep depletion type. The CCD image sensor is, for example, eXcelon™ manufactured by Cypress Semiconductor Inc. The range of imaging wavelengths is, for example, 310 nm to 1024 nm. The device format is, for example, 1024 ch×1024 ch. The image area is, for example, 13.3 mm×13.3 mm. The element size is, for example, 13 μm×13 μm. The number of pixels is, for example, 480 pixel×640 pixel. The image size is, for example, 1.9 mm×2.6 mm.

Color image sensor 235 may be, for example, a CMOS (complementary metal oxide semiconductor) image sensor. The CMOS image sensor is, for example, ORCA™-Fusion manufactured by HAMAMATSU PHOTONICS K.K. The range of imaging wavelengths is, for example, 350 nm to 1000 nm. The effective device size is 14.98 mm×14.98 mm. The pixel size is 6.5 μm×6.5 μm. Each of first defect 10 and second defect 20 in first main surface 6 of silicon carbide epitaxial substrate 100 is specified based on the color image obtained from the color image sensor.

Note that RGB color space is one of color expression methods for expressing a color by red, green, and blue. In RGB color space, the range of R is 0 to 255, the range of G is 0 to 255, and the range of B is 0 to 255. R, G, and B are represented by decimal numbers, for example. The (R, G, B) of red is (255, 0, 0). The (R, G, B) of green is (0, 255, 0). The (R, G, B) of blue is (0, 0, 255). Based on RGB color space obtained from the color image sensor, each of first defect 10 and second defect 20 is specified.

As shown in FIG. 6, first defect 10 is constituted of fourth region S4. Fourth region S4 is polygonal. Fourth region S4 is incorporated into first region S1. As shown in FIG. 11, second defect 20 includes third region S3 and second region S2. Second region S2 is in contact with third region S3. As viewed in the direction perpendicular to first main surface 6, third region S3 is polygonal. Second defect 20 is surrounded by fifth region S5. The range of R, the range of G, and the range of B in RGB color space of each of first region S1, second region S2, third region S3, fourth region S4, and fifth region S5 are as described above.

While moving silicon carbide epitaxial substrate 100 in a direction parallel to first main surface 6, a color image of entire first rain surface 6 is captured. In the obtained color image, the area density of each of first defect 10 and second defect 20 is obtained. Specifically, a value obtained by dividing the number of first defects 10 by the observation area of first main surface 6 is the area density of first defects 10. Similarly, a value obtained by dividing the number of second defect 20 by the observation area of first main surface 6 is the area density of second defects 20.

(Method for Manufacturing Silicon Carbide Epitaxial Substrate)

Next, a method for manufacturing silicon carbide epitaxial substrate 100 according to an embodiment of the present disclosure will be described.

First, silicon carbide substrate 30 is prepared. For example, a silicon carbide single crystal of the 4H polytype is produced by the sublimation method. Next, silicon carbide substrate 30 is prepared by slicing a silicon carbide single crystal with, for example, a wire saw. Silicon carbide substrate 30 contains an n-type impurity such as nitrogen. The conductivity type of silicon carbide substrate 30 is, for example, n-type. Next, mechanical polishing is performed on silicon carbide substrate 30. Next, chemical mechanical polishing is performed on silicon carbide substrate 30.

Next, silicon carbide epitaxial layer 40 is formed on silicon carbide substrate 30. Specifically, silicon carbide epitaxial layer 40 is formed by epitaxial growth on third main surface 9 of silicon carbide substrate 30 by a CVD (Chemical Vapor Deposition) method, for example. In the epitaxial growth, for example, silane ($SiH_4$) and propane ($C_3H_8$) are used as source gases, and hydrogen ($H_2$) is used as a carrier gas. The temperature of the epitaxial growth is, for example, about 1400° C. to 1700° C. In the epitaxial growth, n-type impurities such as nitrogen are introduced into silicon carbide epitaxial layer 40.

Figure 14:
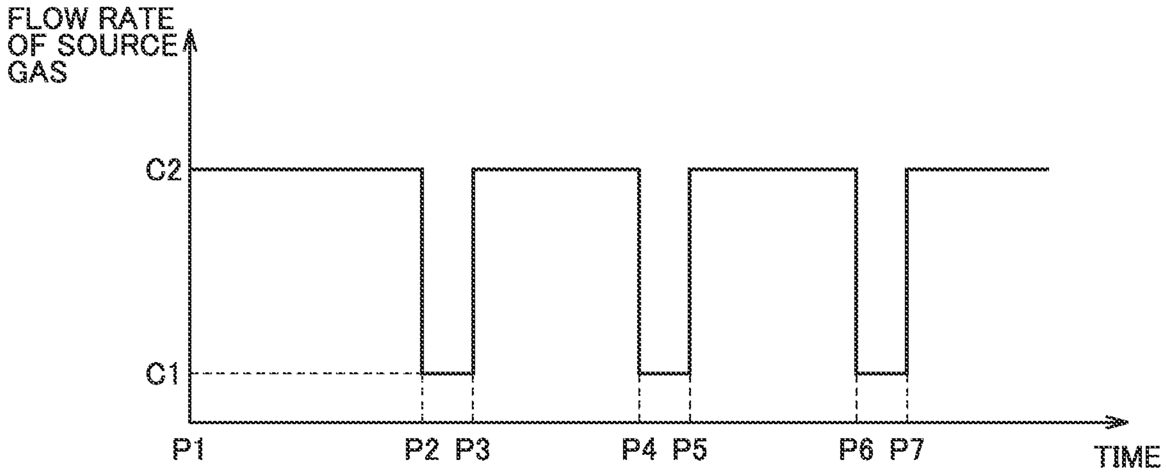
FIG. 14 is a schematic diagram showing the relationship between the flow rate of the source gas and time.

FIG. 14 is a schematic diagram showing the relationship between the flow rate of the source gas and time. As shown in FIG. 14, at a first time point P1, the flow rate of the source gas is set to a second flow rate C2. From first time point P1 to a second time point P2, the flow rate of the source gas is maintained at second flow rate C2. Silicon carbide epitaxial layer 40 is grown from first time point P1 to second time point P2. At second time point P2, the flow rate of the source gas decreases from second flow rate C2 to a first flow rate C1. From second time point P2 to a third time point P3, the flow rate of the source gas is maintained at first flow rate C1 From second time point P2 to third time point P3, silicon carbide epitaxial layer 40 is etched. At third time point P3, the flow rate of the source gas increases from first flow rate C1 to second flow rate C2. From third time point P3 to a fourth time point P4, the flow rate of the source gas is maintained at second flow rate C2. From third time point P3 to fourth time point P4, silicon carbide epitaxial layer 40 is grown again.

Similarly, at fourth time point P4, the flow rate of the source gas decreases from second flow rate C2 to first flow rate C1. From fourth time point P4 to a fifth time point P5, the flow rate of the source gas is maintained at first flow rate C1. At fifth time point P5, the flow rate of the source gas increases from first flow rate C1 to second flow rate C2. From fifth time point P5 to a sixth time point P6, the flow rate of the source gas is maintained at second flow rate C2. From sixth time point P6 to a seventh time point P7, the flow rate of the source gas is maintained at first flow rate CL.

As described above, in the process of forming silicon carbide epitaxial layer 40 on silicon carbide substrate 30, the flow rate of the source gas introduced into the film forming chamber is intermittently changed. First flow rate C1 may be 0 or may be a very small value. First flow rate C1 may be 1/100 or less of second flow rate C2, for example. Second flow rate C2 is, for example, 140 sccm. The flow rate of the source gas is, for example, the sum of the flow rate of the silane gas and the flow rate of the propane gas. The C/Si ratio is 1.0 to 1.3, for example.

Figure 15:
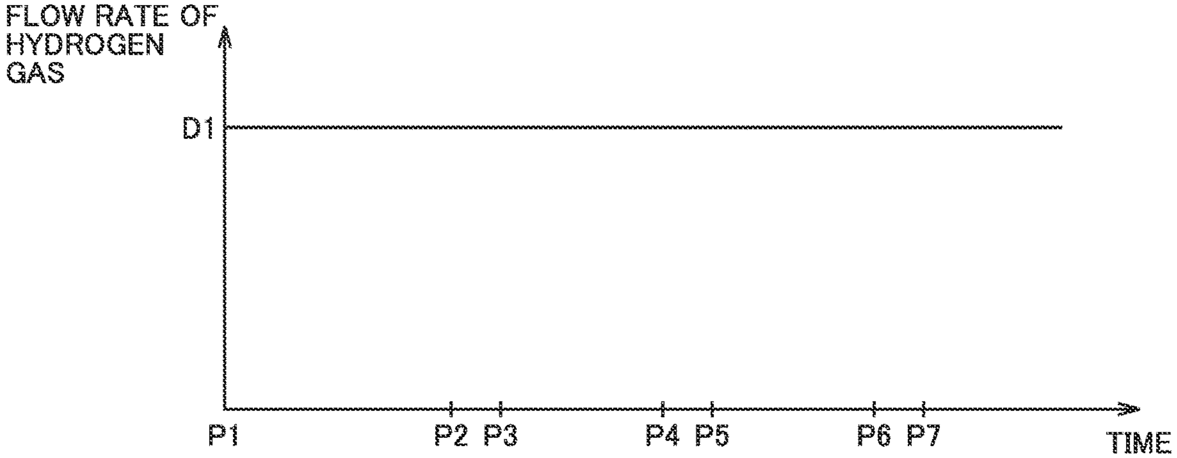
FIG. 15 is a schematic diagram showing the relationship between the flow rate of hydrogen gas and time.

FIG. 15 is a schematic diagram showing the relationship between the flow rate of hydrogen gas and time. As shown in FIG. 14, at first time point P1, the flow rate of hydrogen gas is set to a third flow rate D1. From first time point P1 to seventh time point P7, the flow rate of the hydrogen gas is maintained at third flow rate D1. Third flow rate D1 is, for example, 134 slm.

From first time point P1 to second time point P2, from third time point P3 to fourth time point P4, and from fifth time point P5 to sixth time point P6, the growth rate of silicon carbide epitaxial layer 40 is higher than the etching rate of silicon carbide epitaxial layer 40. Therefore, silicon carbide epitaxial layer 40 is substantially grown. On the other hand, the growth rate of silicon carbide epitaxial layer 40 is lower than the etching rate of silicon carbide epitaxial layer 40 from second time point P2 to third time point P3, from fourth time point P4 to fifth time point P5, and from sixth time point P6 to seventh time point P7. Thus, silicon carbide epitaxial layer 40 is substantially etched.

As described above, in the process of forming silicon carbide epitaxial layer 40 on silicon carbide substrate 30, the substantial growth of silicon carbide epitaxial layer 40 and the substantial etching of silicon carbide epitaxial layer 40 are alternately repeated. The time during which silicon carbide epitaxial layer 40 is substantially etched (such as the time from second time point P2 to third time point P3) is, for example, 0.5 minutes to 3 minutes. The time during which silicon carbide epitaxial layer 40 substantially grows (such as the time from first time point P1 to second time point P2) is, for example, 10 minutes to 30 minutes.

Next, operational effects of silicon carbide epitaxial substrate 100 according to the embodiment of the present disclosure will be described.

When silicon carbide epitaxial layer 40 is formed on silicon carbide substrate 30 by epitaxial growth, first defect 10 and second defect 20 may be formed on main surface 6 of silicon carbide epitaxial substrate 100. Each of first defect 10 and second defect 20 is formed originating from screw dislocation 110 present in silicon carbide substrate 30.

First defect 10 is accompanied by first recess 13. As viewed in the direction perpendicular to first main surface 6, first recess 13 extends in a straight line along a direction inclined with respect to each of first direction 101 and second direction 102 perpendicular to first direction 101, and first-direction-side end portion 11 of first recess 13 is contiguous to first region S1 of the 4H polytype. First recess 13 may be called a carrot defect.

Second defect 20 is accompanied by second recess 23. As viewed in the direction perpendicular to first main surface 6, second recess 23 extends in a straight line along a direction inclined with respect to each of first direction 101 and second direction 102, and first-direction-side end portion 21 of second recess 23 is contiguous to second region S2 of the 3C polytype. Second recess 23 may be called a carrot defect. Second region S2 of the 3C polytype may be called a triangular defect.

Based on the findings of the inventors, it has been confirmed that when a silicon carbide semiconductor device is manufactured using silicon carbide epitaxial substrate 100 including second defect 20, the probability that the silicon carbide semiconductor device does not operate normally is high. On the other hand, it has been confirmed that in the case where a silicon carbide semiconductor device is manufactured using silicon carbide epitaxial substrate 100 including first defect 10, the probability that the silicon carbide semiconductor device does not operate normally is significantly lower than that in the case where second defect 20 is included. Therefore, in order to improve the yield of the silicon carbide semiconductor device, it is desirable to reduce second defect 20.

As a result of intensive studies on measures for reducing second defect 20, the inventors have obtained the following findings and found silicon carbide epitaxial substrate 100 according to an embodiment of the present disclosure.

Figure 16:
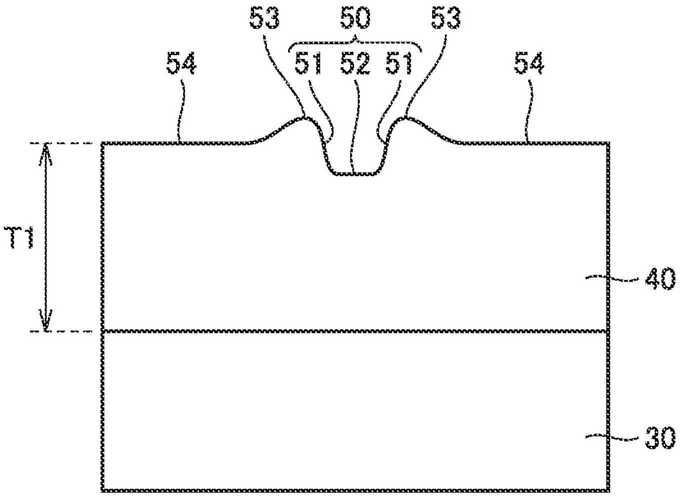
FIG. 16 is a schematic cross-sectional view showing the structure of a silicon carbide epitaxial layer at the initial stage of growth.

FIG. 16 is a schematic cross-sectional view showing the structure of silicon carbide epitaxial layer 40 at the initial stage of growth. As shown in FIG. 16, the surface of silicon carbide epitaxial layer 40 has a fourth recess 50, a pair of fourth projecting portions 53, and a flat surface 54. Each of the pair of fourth projecting portions 53 is beside both sides of fourth recess 50. Fourth recess 50 is defined by a pair of fourth side surfaces 51 and fourth bottom surface 52. Each of the pair of fourth projecting portions 53 is contiguous to flat surface 54. Fourth recess 50 and the pair of fourth projecting portions 53 constitute carrot defect. In FIG. 16, the thickness of silicon carbide epitaxial layer 40 is a first thickness T1.

Figure 17:
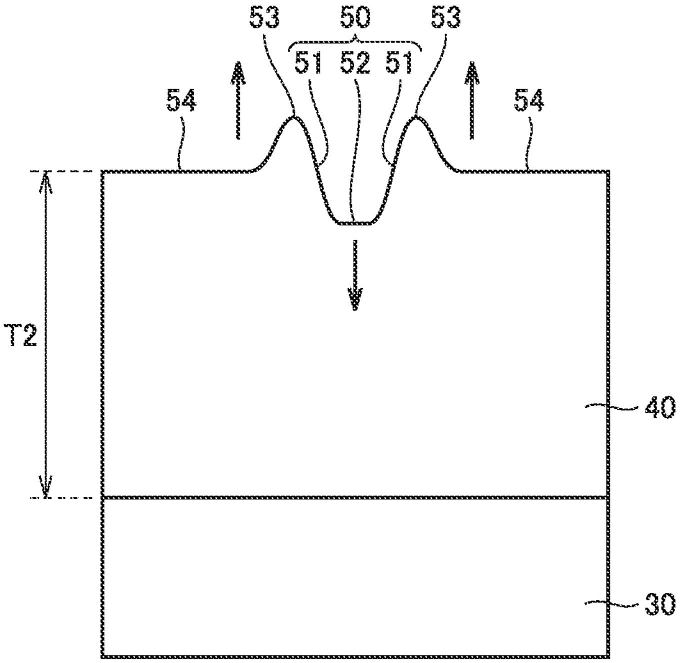
FIG. 17 is a schematic cross-sectional view showing the structure of a silicon carbide epitaxial layer at a substantially growing stage.

FIG. 17 is a schematic cross-sectional view showing the structure of silicon carbide epitaxial layer 40 at a substantially growing stage. As shown in FIG. 17, when silicon carbide epitaxial layer 40 is substantially grown, the height of each of the pair of fourth projecting portions 53 is increased and the depth of fourth recess 50 is also increased as compared to silicon carbide epitaxial layer 40 at the initial growth stage. Continuing the epitaxial growth in this state, disturbing to maintain 41H polytype for the silicon carbide region constituting the pair of fourth projecting portions 53 and fourth recess 50. As a result, the silicon carbide region constituting the pair of fourth projecting portion 53 and fourth recess 50 is changed to, for example, a region having 3C polytype (second region S2). As a result, second defect 20 is formed.

The carrot defect constituted by fourth recess 50 and the pair of fourth projecting portions 53 becomes larger as silicon carbide epitaxial layer 40 becomes thicker. As the thickness of silicon carbide epitaxial layer 40 increases, second defect 20 tends to occur more easily. Second defect 20 tends to be formed more easily in the later stage of the growth of silicon carbide epitaxial layer 40 than in the initial stage of the growth of silicon carbide epitaxial layer 40. In FIG. 17, the thickness of silicon carbide epitaxial layer 40 is a second thickness T2. Second thickness T2 is greater than first thickness T1.

Figure 18:
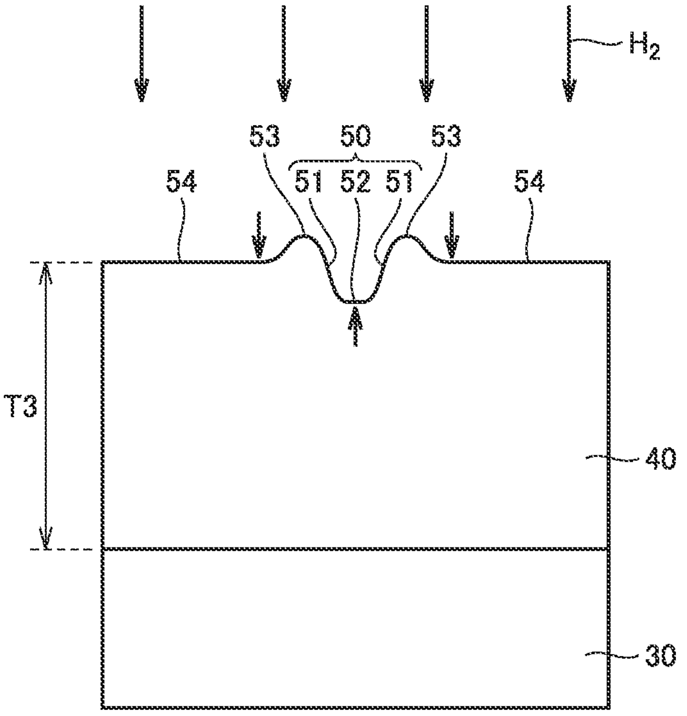
FIG. 18 is a schematic cross-sectional view showing the structure of the silicon carbide epitaxial layer at a substantially etched stage.

FIG. 18 is a schematic cross-sectional view showing the structure of silicon carbide epitaxial layer 40 at a substantially etched stage. As shown in FIG. 18, by etching the surface of silicon carbide epitaxial layer 40 with hydrogen, the height of each of the pair of fourth projecting portions 53 is reduced, and the depth of fourth recess 50 is also reduced. Therefore, the silicon carbide region forming the pair of fourth projecting portions 53 and fourth recess 50 can be suppressed from changing from a region having 4H polytype to a region having 3C polytype, for example. As a result, first defect 10 is formed instead of second defect 20. In FIG. 18, the thickness of silicon carbide epitaxial layer 40 is a third thickness T3. Third thickness T3 is smaller than second thickness T2.

As described above, by alternately repeating the growth of silicon carbide epitaxial layer 40 and the etching of silicon carbide epitaxial layer 40, it is possible to suppressed the height of fourth projecting portion 53 from becoming excessively high and the depth of fourth recess 50 from becoming excessively deep. As a result, the silicon carbide region constituting the pair of fourth projecting portions 53 and fourth recess 50 can be suppressed from becoming second defect 20. From another viewpoint, the silicon carbide region constituting the pair of fourth projecting portions 53 and fourth recess 50 can be promoted to become first defect 10 while suppressing occurrence of second defect 20.

In silicon carbide epitaxial substrate 100 according to the present disclosure, when a defect originating from first screw dislocation 111 among the plurality of screw dislocations 110 is first defect 10, a defect originating from second screw dislocation 112 among the plurality of screw dislocations 110 is second defect 20, an area density of first defect 10 is first area density, and an area density of second defect 20 is second area density, the first area density is $0.03/cm^2$ or more, and a value obtained by dividing the second area density by a sum of the first area density and the second area density is 10% or less. Thus, the yield of the silicon carbide semiconductor device can be improved.

From another viewpoint, by alternately repeating the substantial growth of silicon carbide epitaxial layer 40 and the substantial etching of silicon carbide epitaxial layer 40, it is possible to promote fourth recess 50 to become first recess 13 and to suppress fourth recess 50 from becoming second recess 23.

In silicon carbide epitaxial substrate 100 according to the present disclosure, when a recess originating from first screw dislocation 111 among the plurality of screw dislocations 110 is first recess 13, a recess originating from second screw dislocation 112 among the plurality of screw dislocations 110 is second recess 23, an area density of first recess 13 is a first area density, and an area density of second recess 23 is a second area density, the first area density is $0.03/cm^2$ or more, and a value obtained by dividing the second area density by a sum of the first area density and the second area density is 10% or less. Thus, the yield of the silicon carbide semiconductor device can be improved.

EXAMPLES (Sample Preparation)

First, silicon carbide epitaxial substrates 100 according to samples 1 to 27 were prepared. Silicon carbide epitaxial substrates 100 according to the samples 1 to 10 are examples. Silicon carbide epitaxial substrates 100 according to the samples 11 to 27 are comparative examples.

Silicon carbide epitaxial substrates 100 according to the samples 1 to 10 were manufactured according to the method described in FIGS. 14 and 15. Specifically, during the formation of silicon carbide epitaxial layer 40, the flow rate of hydrogen was maintained at 134 slm. Meanwhile, the flow rate of the source gas was intermittently changed during the process of forming silicon carbide epitaxial layer 40. Specifically, supply and stop of the source gas to the chamber were alternately repeated. The time during which the source gas was supplied to the chamber was 20 minutes. The flow rate of the silane gas was 150 sccm. The flow rate of propane gas was 60 sccm. The time during which the supply of the source gas to the chamber was stopped was 1.5 minutes. While the source gas was supplied to the chamber, silicon carbide epitaxial layer 40 was substantially grown. While the supply of the source gas to the chamber was stopped, silicon carbide epitaxial layer 40 was substantially etched.

Silicon carbide epitaxial substrates 100 according to the samples 11 to 27 were manufactured as follows. Specifically, during the formation of silicon carbide epitaxial layer 40, the flow rate of hydrogen was maintained in 134 slm. During the process of forming silicon carbide epitaxial layer 40, the flow rate of the source gas was maintained at a constant value. In particular, the flow rate of the silane gas was maintained at 150 sccm. The flow rate of propane gas was maintained at 60 sccm.

Experimental Method

The area density of each of first recess 13 and second recess 23 on first main surface 6 of silicon carbide epitaxial substrate 100 according to the samples 1 to 27 was measured using a defect inspection apparatus (WASAVI series "SICA 6X") manufactured by Lasertec corporation. Based on the area density of first recess 13 and the area density of second recess 23, a value (also referred to as a defect rate) obtained by dividing the area density of second recess 23 by the sum of the area density of first recess 13 and the area density of second recess 23 was calculated. The magnification of the objective lens of the defect inspection apparatus was ten times. A mercury-xenon lamp was used as a light source. The entire surface of first main surface 6 was irradiated with light having a wavelength 546 nm. The reflected light was observed by a light receiving element.

Experimental Results

Figure 19:
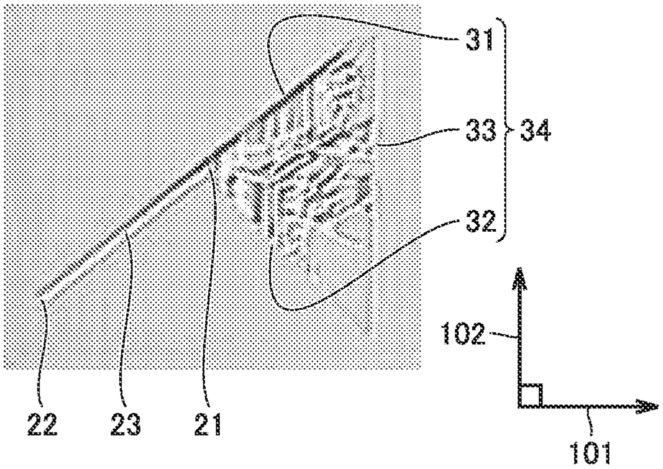
FIG. 19 is an SICA image showing a first example of a second recess.
Figure 20:
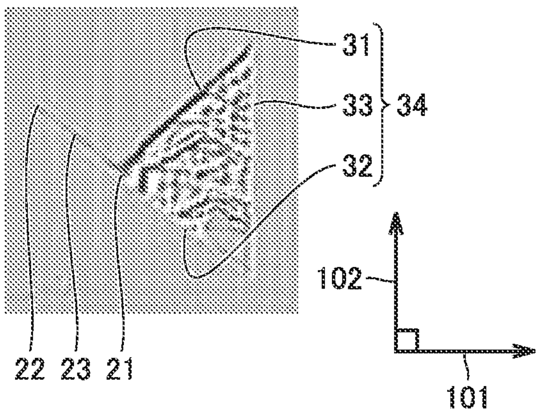
FIG. 20 is an SICA image showing a second example of a second recess.

FIG. 19 is an SICA image showing a first example of second recess 23. FIG. 20 is an SICA image showing a second example of second recess 23. As shown in FIGS. 19 and 20, second defect 20 is accompanied by second recess 23. As viewed in the direction perpendicular to first main surface 6, second recess 23 extends along a straight line in a direction inclined with respect to each of first direction 101 and second direction 102. First-direction-side end portion 21 of second recess 23 is contiguous to uneven region 34 (see FIGS. 7 and 12). On the other hand, a recess extending in a straight line along a direction inclined with respect to each of first direction 101 and second direction 102 and not contiguous to uneven region 34 is first recess 13 (see FIG. 3).

TABLE 1

| Sample No. | (1) Area Density of First Recess (/cm$^2$) | (2) Area Density of Second Recess (/cm$^2$) | Defect Rate (%) ((2)/((1) + (2))) |
|---|---|---|---|
| Sample 1 | 0.18 | 0.00 | 0.0 |
| Sample 2 | 0.34 | 0.00 | 0.0 |
| Sample 3 | 0.61 | 0.00 | 0.0 |
| Sample 4 | 0.52 | 0.00 | 0.0 |
| Sample 5 | 0.12 | 0.01 | 4.8 |
| Sample 6 | 0.76 | 0.00 | 0.0 |
| Sample 7 | 0.14 | 0.01 | 4.3 |
| Sample 8 | 0.29 | 0.01 | 2.1 |

TABLE 1-continued

| Sample No. | (1) Area Density of First Recess (/cm$^2$) | (2) Area Density of Second Recess (/cm$^2$) | Defect Rate (%) ((2)/((1) + (2))) |
|---|---|---|---|
| Sample 9 | 0.55 | 0.00 | 0.0 |
| Sample 10 | 0.39 | 0.01 | 1.5 |

Table 1 shows the area density of first recess 13, the area density of second recess 23, and the value (defect rate) obtained by dividing the area density of second recess 23 by the sum of the area density of first recess 13 and the area density of second recess 23 in first main surface 6 of silicon carbide epitaxial substrate 100 of the embodiment. As shown in Table 1, the area density of first recess 13 was 0.12 (/cm$^2$) to 0.76 (/cm$^2$). The area density of second recess 23 was 0 (/cm$^2$) to 0.01 (/cm$^2$). A value (defect rate) obtained by dividing the area density of second recess 23 by the sum of the area density of first recess 13 and the area density of second recess 23 was 0% to 4.8%.

TABLE 2

| Sample No. | (1) Area Density of First Recess (/cm$^2$) | (2) Area Density of Second Recess (/cm$^2$) | Defect Rate (%) ((2)/((1) + (2))) |
|---|---|---|---|
| Sample 11 | 0.21 | 0.13 | 37.5 |
| Sample 12 | 0.24 | 0.10 | 29.1 |
| Sample 13 | 0.09 | 0.05 | 34.8 |
| Sample 14 | 0.43 | 0.10 | 19.5 |
| Sample 15 | 0.71 | 0.41 | 36.3 |
| Sample 16 | 0.25 | 0.14 | 35.5 |
| Sample 17 | 0.72 | 0.46 | 38.9 |
| Sample 18 | 0.14 | 0.07 | 35.3 |
| Sample 19 | 0.23 | 0.09 | 27.5 |
| Sample 20 | 0.17 | 0.04 | 18.2 |
| Sample 21 | 0.37 | 0.13 | 25.6 |
| Sample 22 | 0.30 | 0.18 | 38.0 |
| Sample 23 | 0.19 | 0.06 | 22.5 |
| Sample 24 | 0.12 | 0.04 | 25.9 |
| Sample 25 | 0.66 | 0.15 | 18.2 |
| Sample 26 | 0.09 | 0.06 | 40.0 |
| Sample 27 | 0.29 | 0.16 | 35.1 |

Table 2 shows the area density of first recess 13, the area density of second recess 23, and the value (defect rate) obtained by dividing the area density of second recess 23 by the sum of the area density of first recess 13 and the area density of second recess 23 in first main surface 6 of silicon carbide epitaxial substrate 100 of the comparative example. As shown in Table 2, the area density of first recess 13 was 0.09 (/cm$^2$) to 0.72 (/cm$^2$). The area density of second recesses 23 was 0.04 (/cm$^2$) to 0.46 (/cm$^2$). A value (defect rate) obtained by dividing the area density of second recess 23 by the sum of the area density of first recess 13 and the area density of second recess 23 was 18.2% to 40.0%.

It is to be understood that the embodiments and examples disclosed herein are illustrative in all respects and are not restrictive. The scope of the present invention is defined not by the above-described embodiments and examples but by the claims, and is intended to include meanings equivalent to the claims and all modifications within the scope.

REFERENCE SIGNS LIST

1 first stacking fault, 2 second stacking fault, 3 orientation flat, 4 arc-shaped portion, 5 outer peripheral edge, 6 first main surface (main surface), 7 boundary surface, 8 second main surface, 9 third main surface, 10 first defect, 11 first end portion (first-direction-side end portion), 12 second end portion, 13 first recess, 14 first pit, 15 first projecting portion, 16 first upper surface, 17 first base, 20 second defect, 21 third end portion (first-direction-side end portion), 22 fourth end portion, 23 second recess, 24 second pit, 25 second projecting portion, 26 second upper surface, 27 second base, 30 silicon carbide substrate, 31 first line segment, 32 second line segment, 33 third line segment, 34 uneven region, 35 third recess, 37 third projecting portion, 40 silicon carbide epitaxial layer, 41 first side surface, 42 first bottom surface, 43 second side surface, 44 second bottom surface, 45 third side surface, 46 third bottom surface, 47 buffer layer, 48 drift layer, 50 fourth recess, 51 fourth side surface, 52 fourth bottom surface, 53 fourth projecting portion, 54 flat surface, 100 silicon carbide epitaxial substrate, 101 first direction, 102 second direction, 110 screw dislocation, 111 first screw dislocation, 112 second screw dislocation, 200 photoluminescence imaging apparatus, 220 excitation light generation unit, 221 light source, 222 light guide, 223 filter, 230 imaging unit, 231 controller, 232 stage, 233 near-infrared objective lens, 235 color image sensor, A1 first length, A2 second length, A3 third length, A4 fourth length, A5 fifth length, A6 sixth length, A7 seventh length, B1 eighth length, B2 ninth length, C1 first flow rate, C2 second flow rate, D1 third flow rate, LE excitation light, LL photoluminescence light, P1 first time point, P2 second time point, P3 third time point, P4 fourth time point, P5 fifth time point, P6 sixth time point, P7 seventh time point, S1 first region, S2 second region, S3 third region, S4 fourth region, S5 fifth region, T1 first thickness, T2 second thickness, T3 third thickness, T4 fourth thickness, W1 maximum diameter

The invention claimed is:

1. A silicon carbide epitaxial substrate comprising:

a silicon carbide substrate including a plurality of screw dislocations; and a silicon carbide epitaxial layer being on the silicon carbide substrate, wherein the silicon carbide epitaxial layer has a boundary surface in contact with the silicon carbide substrate and a main surface opposite to the boundary surface, the main surface is a plane tilted relative to a {0001} plane in a first direction, when a recess originating from a first screw dislocation among the plurality of screw dislocations is a first recess, a recess originating from a second screw dislocation among the plurality of screw dislocations is a second recess, an area density of the first recess is a first area density, and an area density of the second recess is a second area density, the first area density is 0.03/cm$^2$ or more, and a value obtained by dividing the second area density by a sum of the first area density and the second area density is 10% or less, as viewed in a direction perpendicular to the main surface, the first recess extends in a straight line along a direction inclined with respect to each of the first direction and a second direction perpendicular to the first direction, and a first-direction-side end portion of the first recess is contiguous to a 4H polytype region, and as viewed in the direction perpendicular to the main surface, the second recess extends in a straight line along a direction inclined with respect to each of the first direction and the second direction, and a first-direction-side end portion of the second recess is contiguous to a 3C polytype region.

2. A silicon carbide epitaxial substrate comprising:

a silicon carbide substrate including a plurality of screw dislocations; and a silicon carbide epitaxial layer being on the silicon carbide substrate, wherein the silicon carbide epitaxial layer has a boundary surface in contact with the silicon carbide substrate and a main surface opposite to the boundary surface, the main surface is a plane tilted relative to a {0001} plane in a first direction, when a recess originating from a first screw dislocation among the plurality of screw dislocations is a first recess, a recess originating from a second screw dislocation among the plurality of screw dislocations is a second recess, an area density of the first recess is a first area density, and an area density of the second recess is a second area density, the first area density is 0.03/cm$^2$ or more, and a value obtained by dividing the second area density by a sum of the first area density and the second area density is 10% or less, as viewed in a direction perpendicular to the main surface, the first recess extends in a straight line along a direction inclined with respect to each of the first direction and a second direction perpendicular to the first direction, and a first-direction-side end portion of the first recess is contiguous to a fourth region, as viewed in the direction perpendicular to the main surface, the second recess extends in a straight line along a direction inclined with respect to each of the first direction and the second direction, and a first-direction-side end portion of the second recess is contiguous to a second region, when photoluminescence light generated from the fourth region upon irradiation of the fourth region with excitation light is expressed in RGB color space, R is 161 to 231, G is 224 to 254, and B is 252 to 255, and when photoluminescence light generated from the second region upon irradiation of the second region with excitation light is expressed in RGB color space, R is 56 to 115, G is 71 to 128, and B is 56 to 123.

3. A silicon carbide epitaxial substrate comprising:

a silicon carbide substrate including a plurality of screw dislocations; and a silicon carbide epitaxial layer being on the silicon carbide substrate, wherein the silicon carbide epitaxial layer has a boundary surface in contact with the silicon carbide substrate and a main surface opposite to the boundary surface, the main surface is a plane tilted relative to a {0001} plane in a first direction, when a recess originating from a first screw dislocation among the plurality of screw dislocations is a first recess, a recess originating from a second screw dislocation among the plurality of screw dislocations is a second recess, an area density of the first recess is a first area density, and an area density of the second recess is a second area density, the first area density is 0.03/cm$^2$ or more, and a value obtained by dividing the second area density by a sum of the first area density and the second area density is 10% or less, as viewed in a direction perpendicular to the main surface, the first recess extends in a straight line along a direction inclined with respect to each of the first direction and a second direction perpendicular to the first direction, as viewed in the direction perpendicular to the main surface, the second recess extends in a straight line along a direction inclined with respect to each of the first direction and the second direction, and a first-direction-side end portion of the second recess is contiguous to an uneven region, the uneven region is located between a first line segment contiguous to the second recess and a second line segment contiguous to the second recess and inclined with respect to the first line segment as viewed in the direction perpendicular to the main surface, and the uneven region is spaced apart from the first recess.

4. The silicon carbide epitaxial substrate according to claim 1, wherein, in a cross section perpendicular to a direction in which the first recess extends, a pair of first projecting portions is provided beside both sides of the first recess.

5. The silicon carbide epitaxial substrate according to claim 1, wherein, in a cross section perpendicular to a direction in which the second recess extends, a pair of second projecting portions is provided beside both sides of the second recess.

6. A silicon carbide epitaxial substrate comprising:

a silicon carbide substrate including a plurality of screw dislocations; and a silicon carbide epitaxial layer being on the silicon carbide substrate, wherein the silicon carbide epitaxial layer has a boundary surface in contact with the silicon carbide substrate and a main surface opposite to the boundary surface, the main surface is a plane tilted relative to a {0001} plane in a first direction, when a defect originating from a first screw dislocation among the plurality of screw dislocations is a first defect, a defect originating from a second screw dislocation among the plurality of screw dislocations is a second defect, an area density of the first defect is a first area density, and an area density of the second defect is a second area density, the first area density is $0.03/cm^2$ or more, and a value obtained by dividing the second area density by a sum of the first area density and the second area density is 10% or less, the first defect includes a fourth region that is polygonal and surrounded by a first region as viewed in a direction perpendicular to the main surface, the second defect includes a third region that is polygonal as viewed in the direction perpendicular to the main surface, and a second region in contact with the third region, when photoluminescence light generated from the fourth region upon irradiation of the fourth region with excitation light is expressed in RGB color space, R is 161 to 231, G is 224 to 254, and B is 252 to 255, when photoluminescence light emitted from the first region upon irradiation of the first region with excitation light is expressed in RGB color space, R is 140 to 180, G is 130 to 190, and B is 130 to 190, when photoluminescence light generated from the second region upon irradiation of the second region with excitation light is expressed in RGB color space, R is 56 to 115, G is 71 to 128, and B is 56 to 123, and when photoluminescence light generated from the third region upon irradiation of the third region with excitation light is expressed in RGB color space, R is 161 to 231, G is 224 to 254, and B is 252 to 255.

* * * * *